(12) United States Patent
Kim

(10) Patent No.: US 12,501,756 B2
(45) Date of Patent: Dec. 16, 2025

(54) DISPLAY DEVICE

(71) Applicant: Samsung Display Co., LTD., Yongin-si (KR)

(72) Inventor: Geun Tak Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 847 days.

(21) Appl. No.: 17/459,355

(22) Filed: Aug. 27, 2021

(65) Prior Publication Data

US 2022/0102423 A1 Mar. 31, 2022

(30) Foreign Application Priority Data

Sep. 29, 2020 (KR) .......................... 10-2020-0126902

(51) Int. Cl.
*H10H 29/14* (2025.01)
*H10H 20/80* (2025.01)
*H10H 20/821* (2025.01)
*H10H 20/831* (2025.01)

(52) U.S. Cl.
CPC .......... *H10H 29/142* (2025.01); *H10H 20/80* (2025.01); *H10H 20/821* (2025.01); *H10H 20/831* (2025.01)

(58) Field of Classification Search
CPC .. H10H 29/142; H10H 20/821; H10H 20/831; H10H 20/84; H10H 20/819; H10H 20/818; H01L 25/0753; H01L 25/167; H10D 86/40
See application file for complete search history.

(56) References Cited

U.S. PATENT DOCUMENTS

| | | | |
|---|---|---|---|
| 8,089,079 B2* | 1/2012 | Lee | H01L 25/0753 |
| | | | 257/E33.056 |
| 11,990,566 B2 | 5/2024 | Oh et al. | |
| 2006/0220988 A1* | 10/2006 | Hillis | H01L 24/95 |
| | | | 345/30 |
| 2016/0380158 A1* | 12/2016 | Sasaki | H01L 24/95 |
| | | | 257/89 |
| 2017/0338372 A1* | 11/2017 | Teraguchi | H01L 33/06 |

(Continued)

FOREIGN PATENT DOCUMENTS

| | | |
|---|---|---|
| EP | 3 890 022 | 10/2021 |
| KR | 10-2019-0029831 | 3/2019 |

(Continued)

OTHER PUBLICATIONS

Extended European search report for European Patent Application or Patent No. 21198978.5 dated Feb. 22, 2022.

*Primary Examiner* — Su C Kim
(74) *Attorney, Agent, or Firm* — Womble Bond Dickinson (US) LLP

(57) ABSTRACT

A display device includes subpixels, each of the subpixels including a first electrode extending in a first direction, a second electrode extending in the first direction and spaced apart from the first electrode in a second direction, and light emitting elements disposed on the first electrode and the second electrode and extending in a direction, wherein the subpixels includes a first subpixel including first light emitting elements having a first length in the direction and a second subpixel including second light emitting elements having a second length greater than the first length in the direction.

19 Claims, 19 Drawing Sheets

(56) References Cited

U.S. PATENT DOCUMENTS

| | | | |
|---|---|---|---|
| 2018/0019377 A1* | 1/2018 | Kim | H01L 27/156 |
| 2019/0115513 A1* | 4/2019 | Im | H05K 1/111 |
| 2019/0326348 A1* | 10/2019 | Im | H01L 25/0753 |
| 2019/0378873 A1* | 12/2019 | Lee | H01L 25/0655 |
| 2020/0251451 A1 | 8/2020 | Schuele et al. | |
| 2020/0388599 A1* | 12/2020 | Chen | H01L 33/58 |
| 2022/0093828 A1 | 3/2022 | Kwag et al. | |
| 2024/0313164 A1 | 9/2024 | Oh et al. | |
| 2024/0313165 A1 | 9/2024 | Oh et al. | |

FOREIGN PATENT DOCUMENTS

| | | |
|---|---|---|
| KR | 10-2020-0010701 | 1/2020 |
| KR | 10-2020-0063380 | 6/2020 |
| KR | 10-2020-0063386 | 6/2020 |

\* cited by examiner

DISPLAY DEVICE

CROSS-REFERENCE TO RELATED APPLICATION(S)

This application claims priority to and the benefit of Korean Patent Application No. 10-2020-0126902 under 35 U.S.C. § 119, filed on Sep. 29, 2020 in the Korean Intellectual Property Office (KIPO), and all the benefits accruing therefrom under 35 U.S.C. 119, the entire contents of which are incorporated herein by reference.

BACKGROUND

1. Technical Field

The disclosure relates to a display device.

2. Description of the Related Art

Display devices are becoming increasingly important with the development of multimedia. Accordingly, various types of display devices such as organic light emitting displays and liquid crystal displays are being used.

A display device is a device for displaying an image and includes a display panel such as an organic light emitting display panel or a liquid crystal display panel. As a light emitting display panel, the display panel may include light emitting elements such as light emitting diodes (LEDs). For example, the LEDs may be organic light emitting diodes (OLEDs) using an organic material as a light emitting material or may be inorganic LEDs using an inorganic material as the light emitting material.

SUMMARY

Aspects of the disclosure provide a display device including light emitting elements having different lengths.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may comprise a plurality of subpixels, each of the plurality of subpixels comprising a first electrode extending in a first direction, a second electrode extending in the first direction and spaced apart from the first electrode in a second direction, and a plurality of light emitting elements disposed on the first electrode and the second electrode and extending in a direction. The plurality of subpixels may comprise a first subpixel comprising first light emitting elements each having a first length in the direction, and a second subpixel comprising second light emitting elements each having a second length greater than the first length in the direction.

A first distance between the first electrode and the second electrode of the first subpixel may be smaller than a second distance between the first electrode and the second electrode of the second subpixel.

In the first subpixel, the first distance may be smaller than the first length of each of the first light emitting elements.

Widths of the first electrode and the second electrode of the first subpixel may be equal to widths of the first electrode and the second electrode of the second subpixel, respectively.

The second distance between the first electrode and the second electrode of the second subpixel may be equal to the first length of each of the first light emitting elements.

A difference between the second length of each of the second light emitting elements and the first length of each of the first light emitting elements may be equal to a sum of widths of portions of the first electrode and the second electrode which overlap the first light emitting elements.

The plurality of subpixels may further comprise a third subpixel comprising third light emitting elements each having a third length greater than the second length in the direction.

A third distance between the first electrode and the second electrode of the third subpixel may be equal to the second length of each of the second light emitting elements.

Each of the plurality of subpixels may comprise a first insulating layer disposed on the first electrode and the second electrode, the first insulating layer comprising a first contact portion exposing a portion of an upper surface of the first electrode, and a second contact portion exposing a portion of an upper surface of the second electrode, and a second insulating layer disposed on the first insulating layer, the second insulating layer comprising an opening exposing ends of each of the plurality of light emitting elements. The opening of the second insulating layer may expose the first contact portion and the second contact portion of the first insulating layer.

A width of the opening of the second insulating layer in the first subpixel may be equal to the second length of each of the second light emitting elements.

The display device may further comprise a first contact electrode disposed on the first electrode and electrically contacting first ends of the plurality of light emitting elements and the first electrode, and a second contact electrode disposed on the second electrode and electrically contacting second ends of the plurality of light emitting elements and the second electrode.

The first electrode and the first contact electrode may have a same width, the second electrode and the second contact electrode may have a same width, and a width of a portion of the first electrode which overlaps the plurality of light emitting elements may be half the width of the first electrode.

A distance between the first electrode and the second electrode may be equal to a difference between a length of each of the light emitting elements and the width of the first electrode.

The first subpixel may further comprise the second light emitting elements, and third light emitting elements having a third length greater than the second length in the direction.

The first electrode of the first subpixel may comprise a first electrode portion on which the first light emitting elements are disposed, a second electrode portion on which the second light emitting elements are disposed, and a third electrode portion on which the third light emitting elements are disposed, the second electrode of the first subpixel may comprise a fourth electrode portion on which the first light emitting elements are disposed, a fifth electrode portion on which the second light emitting elements are disposed, and a sixth electrode portion on which the third light emitting elements are disposed, and a distance between the first electrode portion and the fourth electrode portion may be smaller than a distance between the second electrode portion and the fifth electrode part.

The first subpixel may further comprise a third electrode spaced apart from the first electrode in the first direction, a fourth electrode spaced apart from the second electrode in the first direction, a fifth electrode spaced apart from the third electrode in the first direction and a sixth electrode spaced apart from the fourth electrode in the first direction, and the distance between the first electrode and the second electrode may be smaller than a distance between the third electrode and the fourth electrode.

According to an embodiment of the disclosure, a display device may comprise a plurality of electrodes extending in a first direction and spaced apart from each other in a second direction, a first insulating layer disposed on the plurality of electrodes, a plurality of light emitting elements disposed on the first insulating layer and having ends disposed on the plurality of electrodes spaced apart in the second direction, and a plurality of contact electrodes disposed on at least one of the plurality of electrodes to electrically contact the plurality of light emitting elements, wherein the plurality of light emitting elements comprise first light emitting elements having a first length in a direction, and second light emitting elements having a second length greater than the first length in the direction and spaced apart from the first light emitting elements in the first direction.

A distance between portions of the plurality of electrodes on which the first light emitting elements may be disposed is smaller than a distance between portions of the plurality of electrodes on which the second light emitting elements are disposed, and the plurality of contact electrodes may comprise a first contact electrode which plurality of contacts an end of each of the first light emitting elements, a second contact electrode which electrically contacts another end of each of the first light emitting elements, a third contact electrode which electrically contacts an end of each of the second light emitting elements, and a fourth contact electrode which electrically contacts another end of each of the second light emitting elements.

The plurality of electrodes may comprise a first electrode, a second electrode spaced apart from the first electrode in the second direction, a third electrode spaced apart from the first electrode in the first direction, and a fourth electrode spaced apart from the second electrode in the first direction, the first light emitting elements may be disposed on the first electrode and the second electrode, the second light emitting elements may be disposed on the third electrode and the fourth electrode, and a first distance between the first electrode and the second electrode may be smaller than a second distance between the third electrode and the fourth electrode.

The first insulating layer may comprise a plurality of contact portions which partially expose upper surfaces of the plurality of electrodes, and the plurality of contact electrodes electrically contact ends of the plurality of light emitting elements and portions of the upper surfaces of the plurality of electrodes exposed through the plurality of contact portions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the another layer or substrate, or one or more intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Hereinafter, embodiments will be described with reference to the accompanying drawings.

Figure 1:
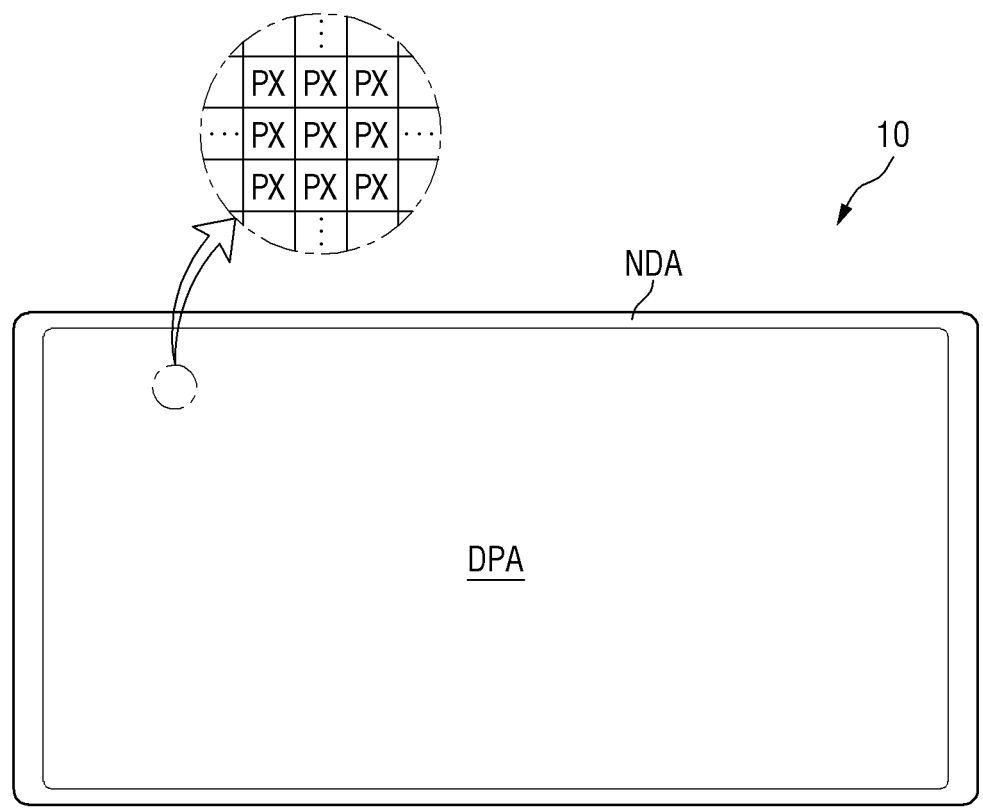
FIG. 1 is a schematic plan view of a display device according to an embodiment.

FIG. 1 is a schematic plan view of a display device 10 according to an embodiment.

Referring to FIG. 1, the display device 10 may display moving images or still images. The display device 10 may refer to any electronic device that provides a display screen. Examples of the display device 10 may include televisions, laptop computers, monitors, billboards, Internet of things (IoT) devices, mobile phones, smartphones, tablet personal computers (PCs), electronic watches, smartwatches, watch phones, head-mounted devices, mobile communication terminals, electronic notebooks, electronic books, portable multimedia players (PMPs), navigation devices, game consoles, digital cameras, and camcorders, which provide a display screen.

The display device 10 may include a display panel that provides a display screen. Examples of the display panel may include inorganic light emitting diode display panels, organic light emitting display panels, quantum dot light emitting display panels, plasma display panels, and field emission display panels. A case where an inorganic light emitting diode display panel is applied as an example of the display panel will be described below, but the disclosure is not limited to this case, and other display panels may also be applied as long as the same technical spirit is applicable thereto.

The shape of the display device 10 may be variously modified. For example, the display device 10 may have various shapes such as a horizontally long rectangle, a vertically long rectangle, a square, a quadrangle with rounded corners (vertices), other polygons, and a circle. The shape of a display area DPA of the display device 10 may also be similar to the overall shape of the display device 10. FIG. 1 illustrates that the display device 10 is shaped like a rectangle that is elongated in a second direction DR2.

The display device 10 may include the display area DPA and a non-display area NDA. The display area DPA may be an area where an image can be displayed, and the non-display area NDA may be an area where an image is not displayed. The display area DPA may also be referred to as an active area, and the non-display area NDA may also be referred to as an inactive area. The display area DPA may generally occupy the center of the display device 10.

The display area DPA may include pixels PX. The pixels PX may be arranged in a matrix direction. Each of the pixels PX may be rectangular or square in a plan view. However, the disclosure is not limited thereto, and each of the pixels PX may also have a rhombic planar shape having each side inclined with respect to a direction. The pixels PX may be alternately arranged in a stripe or PENTILE™ type. Each of the pixels PX may include one or more light emitting elements which emit light of a wavelength band to display a specific color.

The non-display area NDA may be disposed around or adjacent to the display area DPA. The non-display area NDA may entirely or partially surround the display area DPA. The display area DPA may be rectangular, and the non-display area NDA may be disposed adjacent to four sides of the display area DPA. The non-display area NDA may form a bezel of the display device 10. In each non-display area NDA, wirings or circuit drivers included in the display device 10 may be disposed, or external devices may be mounted.

Figure 2:
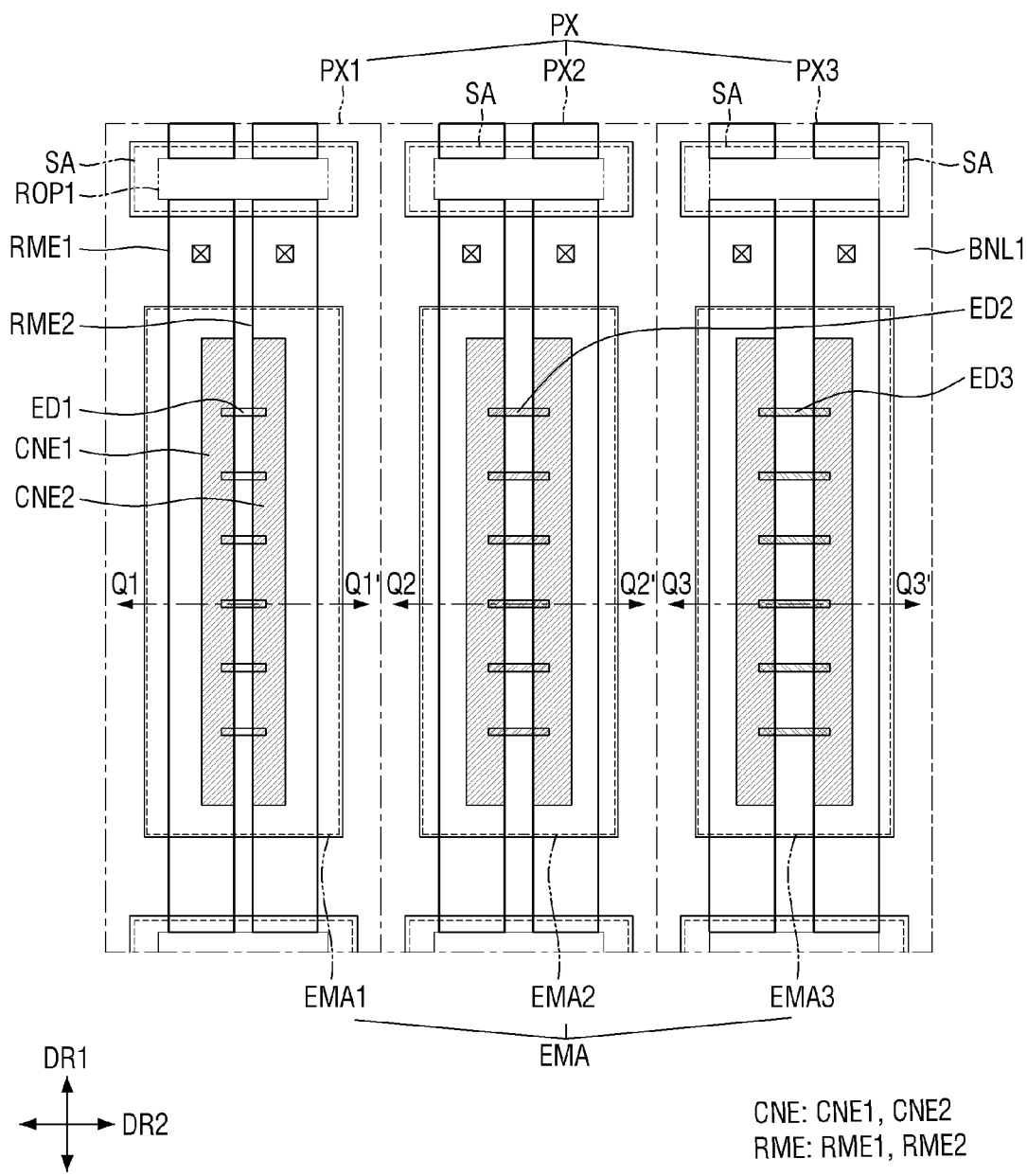
FIG. 2 is a schematic plan view of a pixel of the display device according to the embodiment.

FIG. 2 is a schematic plan view of a pixel PX of the display device 10 according to the embodiment.

Referring to FIG. 2, each of the pixels PX of the display device 10 may include subpixels PXn (where n is 1 to 3). For example, a pixel PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. For example, the first color may be blue, the second color may be green, and the third color may be red.

According to an embodiment, the display device 10 may include different types of light emitting elements ED in different subpixels PXn. The light emitting elements ED disposed in different subpixels PXn may emit light of different colors, and each subpixel PXn may emit light of a different color according to the type of the light emitting elements ED. The light emitting elements ED may extend in a direction, and the light emitting elements ED disposed in different subpixels PXn may extend to different lengths in the direction. Accordingly, a distance between electrodes RME1 and RME2 electrically connected to the light emitting elements ED may be different in different subpixels PXn. This will be described in detail below.

Each subpixel PXn of the display device 10 may include an emission area (or light emission area) EMA and a non-emission area (not illustrated). The emission area EMA may be an area in which the light emitting elements ED are disposed to emit light of a specific wavelength band, and the non-emission area may be an area in which the light emitting elements ED are not disposed and from which no light is output because light emitted from the light emitting elements ED does not reach this area. The emission area EMA may include an area in which the light emitting elements ED are disposed and an area which is adjacent to the light emitting elements ED and from which light emitted from the light emitting elements ED is output.

However, the disclosure is not limited thereto, and the emission area EMA may also include an area from which light emitted from the light emitting elements ED is output after being reflected or refracted by other members. Light emitting elements ED may be disposed in each subpixel PXn, and an area where the light emitting elements ED are disposed and an area adjacent to this area may form the emission area EMA.

Although FIG. 2 illustrates that a first emission area EMA1 of the first subpixel PX1, a second emission area EMA2 of the second subpixel PX2, and a third emission area EMA3 of the third subpixel PX3 have substantially a same area, the disclosure is not limited thereto. In some embodiments, the emission area EMA of each subpixel PXn may have a different area according to the color or wavelength band of light emitted by the light emitting elements ED disposed in the corresponding subpixel PXn.

Each subpixel PXn may further include a subarea SA disposed in the non-emission area. The subarea SA may be disposed on a side of the emission area EMA in a first direction DR1 and may be disposed between the emission areas EMA of subpixels PXn neighboring in the first direction DR1. For example, emission areas EMA and subareas SA may be repeatedly arranged in the second direction DR2 but may be alternately arranged in the first direction DR1. A first bank BNL1 may be disposed between the subareas SA and the emission areas EMA, and a distance between them may vary according to a width of the first bank BNL1. Light may not exit from the subarea SA because the light emitting elements ED are not disposed in the subarea SA, but portions of the electrodes RME1 and RME2 disposed in each subpixel PXn may be disposed in the subarea SA. The electrodes RME1 and RME2 disposed in some subpixels PXn may be separated from each other in the subarea SA.

The first bank BNL1 may include portions extending in the first direction DR1 and the second direction DR2 in a plan view to form a lattice pattern over the entire display area DPA. The first bank BNL1 may be disposed at the boundary between the respective subpixels PXn to separate neighboring subpixels PXn. The first bank BNL1 may surround the emission area EMA and the subarea SA disposed in each subpixel PXn to separate them from each other.

Figure 3:
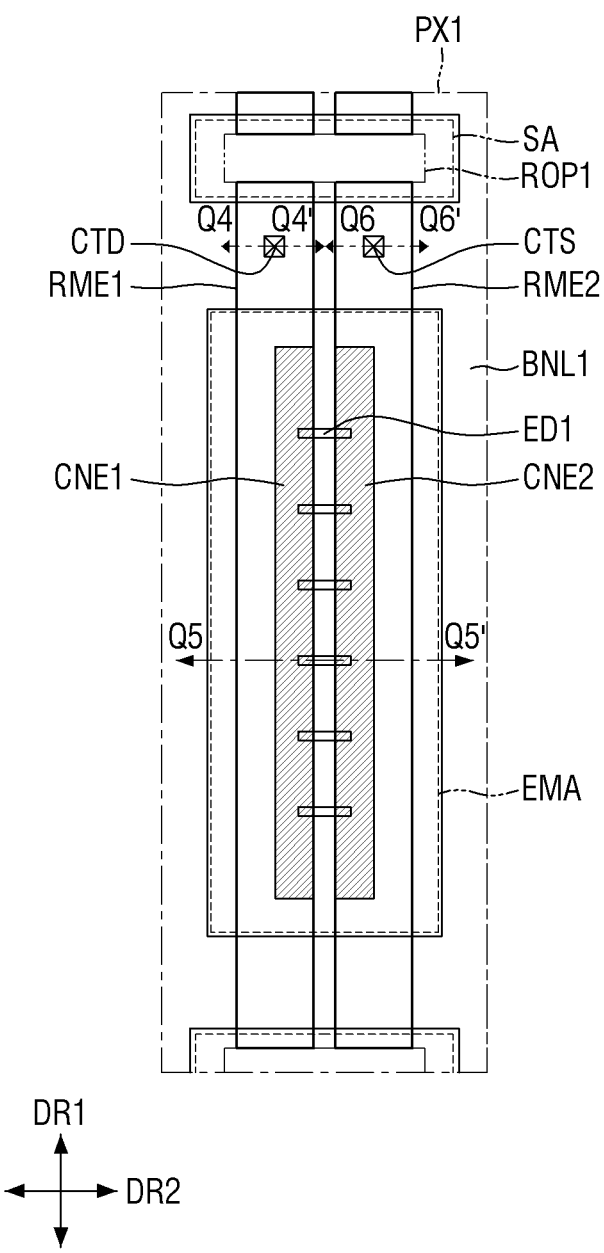
FIG. 3 is a schematic plan view of a first subpixel of FIG. 2.
Figure 4:
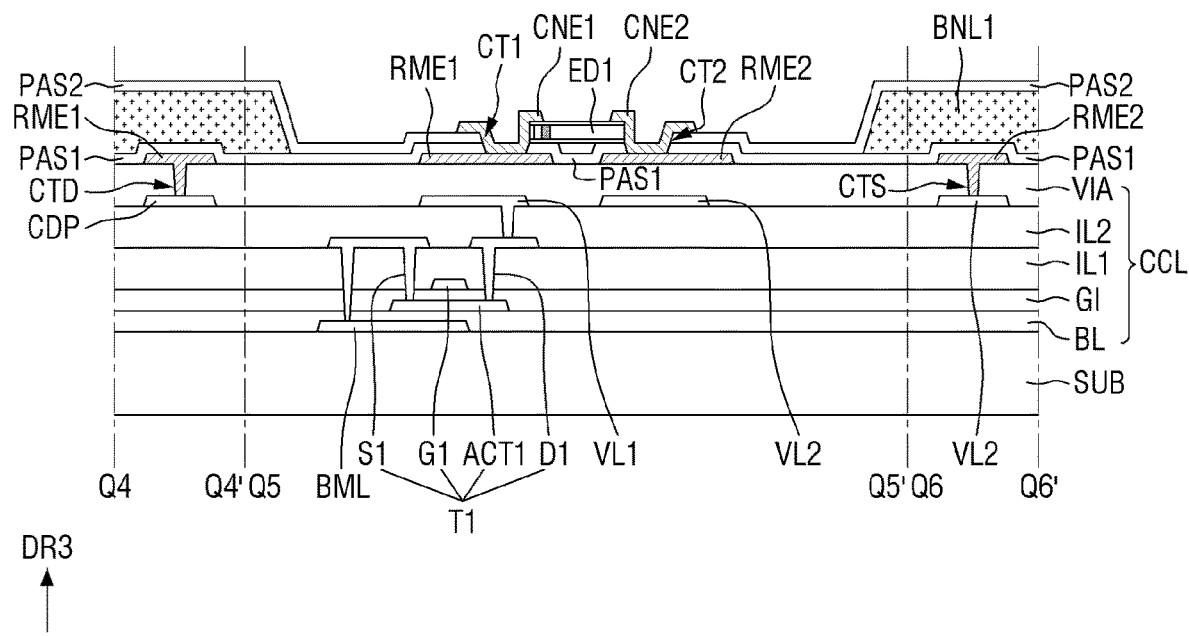
FIG. 4 is a schematic cross-sectional view taken along lines Q4-Q4', Q5-Q5', and Q6-Q6' of FIG. 3.

FIG. 3 is a schematic plan view of the first subpixel PX1 of FIG. 2. FIG. 4 is a schematic cross-sectional view taken along lines Q4-Q4', Q5-Q5', and Q6-Q6' of FIG. 3. FIG. 4 illustrates a cross section across both ends of first light emitting elements ED1 disposed in the first subpixel PX1.

Referring to FIGS. 2, 3, and 4, the display device 10 may include a first substrate SUB and a semiconductor layer, conductive layers and insulating layers disposed on the first substrate SUB. The semiconductor layer, the conductive layers, and the insulating layers may form (or constitute) a circuit layer CCL and a display element layer of the display device 10.

The first substrate SUB may be an insulating substrate. The first substrate SUB may be made of an insulating material such as glass, quartz, or polymer resin. The first substrate SUB may be a rigid substrate or a flexible substrate that may be bent, folded, rolled, etc.

A first conductive layer may be disposed on the first substrate SUB. The first conductive layer includes a bottom metal layer BML, and the bottom metal layer BML may be overlapped by an active layer ACT1 of a first transistor T1. The bottom metal layer BML may include a light blocking material to prevent light from entering the active layer ACT1 of the first transistor T1. In some embodiments, the bottom metal layer BML may be omitted.

A buffer layer BL may be entirely disposed on the bottom metal layer BML and the first substrate SUB. The buffer layer BL may be formed on the first substrate SUB to protect transistors of each pixel PX from moisture introduced through the first substrate SUB which is vulnerable to moisture penetration and may perform a surface planarization function.

The semiconductor layer may be disposed on the buffer layer BL. The semiconductor layer may include the active layer ACT1 of the first transistor T1. The active layer ACT1 of the first transistor T1 may be partially overlapped by a gate electrode G1 of a second conductive layer which will be described below.

The semiconductor layer may include polycrystalline silicon, monocrystalline silicon, an oxide semiconductor, or the like. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although FIG. 4 illustrates only the first transistor T1 among the transistors included in each subpixel PXn of the display device 10, the disclosure is not limited thereto. The display device 10 may include a larger number of transistors.

A first gate insulating layer GI may be disposed on the semiconductor layer and the buffer layer BL. The first gate insulating layer GI may function as a gate insulating film of each transistor.

The second conductive layer may be disposed on the first gate insulating layer GI. The second conductive layer may include the gate electrode G1 of the first transistor T1. The gate electrode G1 may overlap a channel region of the active layer ACT1 in a third direction DR3, which is a thickness direction. Although not illustrated in the drawings, the second conductive layer may further include a capacitive electrode of a storage capacitor.

A first interlayer insulating layer IL1 may be disposed on the second conductive layer. The first interlayer insulating layer IL1 may function as an insulating film between the second conductive layer and other layers disposed on the second conductive layer and may protect the second conductive layer.

A third conductive layer may be disposed on the first interlayer insulating layer IL1. The third conductive layer may include a first source electrode S1 and a first drain electrode D1 of the first transistor T1.

The first source electrode S1 and the first drain electrode D1 of the first transistor T1 may electrically contact the active layer ACT1 through contact holes penetrating the first interlayer insulating layer IL1 and the first gate insulating layer GI. The first source electrode S1 may electrically contact the bottom metal layer BML through another contact hole. Although not illustrated in the drawings, the third conductive layer may further include data wirings or the capacitive electrode of the storage capacitor.

A second interlayer insulating layer IL2 may be disposed on the third conductive layer. The second interlayer insulating layer IL2 may function as an insulating film between the third conductive layer and other layers disposed on the third conductive layer and may protect the third conductive layer.

A fourth conductive layer may be disposed on the second interlayer insulating layer IL2. The fourth conductive layer may include a first voltage wiring VL1, a second voltage wiring VL2, and a first conductive pattern CDP. A high potential voltage (or a first power supply voltage) supplied to the first transistor T1 may be applied to the first voltage wiring VL1, and a low potential voltage (or a second power supply voltage) supplied to a second electrode RME2 may be applied to the second voltage wiring VL2.

The first conductive pattern CDP may be electrically connected to the first transistor T1. The first conductive pattern CDP may also electrically contact a first electrode RME1 described below, and the first transistor T1 may send the first power supply voltage, received from the first voltage wiring VL1, to the first electrode RME1.

Each of the buffer layer BL, the first gate insulating layer GI, the first interlayer insulating layer IL1, and the second interlayer insulating layer IL2 described above may be composed of inorganic layers stacked alternately. For example, each of the buffer layer BL, the first gate insulating layer GI, the first interlayer insulating layer ILL and the second interlayer insulating layer IL2 may be a double layer in which inorganic layers including at least any one of silicon oxide ($SiO_x$), silicon nitride ($SiN_x$), and silicon oxynitride ($SiO_xN_y$) are stacked or may be a multi-layer in which the inorganic layers are alternately stacked. However, the disclosure is not limited thereto, and each of the buffer layer BL, the first gate insulating layer GI, the first interlayer insulating layer IL1, and the second interlayer insulating layer IL2 may also be an inorganic layer including one of the abovementioned insulating materials.

Each of the second conductive layer, the third conductive layer, and the fourth conductive layer may be, but is not limited to, a single layer or multi-layer made of (or include) one or more of molybdenum (Mo), aluminum (Al), chromium (Cr), gold (Au), titanium (Ti), nickel (Ni), neodymium (Nd), copper (Cu), and alloys thereof.

A via layer VIA may be disposed on the fourth conductive layer. The via layer VIA may include an organic insulating material, for example, an organic material such as polyimide (PI) and may perform a surface planarization function.

Electrodes RME, for example electrodes RME1 and RME2, the light emitting elements ED, and contact electrodes CNE, for example contact electrodes CNE1 and CNE2, may be disposed as the display element layer on the via layer VIA. Insulating layers PAS1 and PAS2 may be disposed on the via layer VIA.

The first electrode RME1 and the second electrode RME2 may extend in a direction and may be disposed in each subpixel PXn. For example, the first electrode RME1 and the second electrode RME2 may extend in the first direction DR1 and may be spaced apart from each other in the second direction DR2 in each subpixel PXn.

The first electrode RME1 and the second electrode RME2 may extend beyond a portion of the first bank BNL1, which extends in the second direction DR2, to lie in a portion of the subarea SA of a corresponding subpixel PXn. The first electrodes RME1 and the second electrodes RME2 of different subpixels PXn may be spaced from each other in the subarea SA. The first electrodes RME1 and the second electrodes RME2 of different subpixels PXn may be spaced apart from each other by a first separation portion ROP1 located in the subarea SA of a subpixel PXn.

The first electrode RME1 may be disposed on a left side of the center of the emission area EMA, and the second electrode RME2 may be spaced apart from the first electrode RME1 in the second direction DR2 and may be disposed on a right side of the center of the emission area EMA.

Each of the first electrode RME1 and the second electrode RME2 may be electrically connected to the fourth conductive layer disposed thereunder. For example, the first electrode RME1 may electrically contact the first conductive pattern CDP through a first electrode contact hole CTD penetrating the via layer VIA. The second electrode RME2 may electrically contact the second voltage wiring VL2 through a second electrode contact hole CTS penetrating the via layer VIA. The first electrode RME1 may be electrically connected to the first transistor T1 through the first conductive pattern CDP to receive the first power supply voltage, and the second electrode RME2 may be electrically connected to the second voltage wiring VL2 to receive the second power supply voltage. Since the first electrode RME1 and the second electrode RME2 are disposed separately in each subpixel PXn, the light emitting elements ED of different subpixels PXn may emit light individually.

The electrodes RME1 and RME2 may be electrically connected to the light emitting elements ED. The electrodes RME1 and RME2 may be electrically connected to both ends of the light emitting elements ED through the contact electrodes CNE1 and CNE2 described below and may transmit electrical signals received from the fourth conductive layer to the light emitting elements ED. Electrical signals for causing the light emitting elements ED to emit light may be directly transmitted to the first electrode RME1 and the second electrode RME2.

The first electrode RME1 and the second electrode RME2 may be utilized to generate an electric field in each subpixel PXn to align the light emitting elements ED during a process of fabricating the display device 10. The light emitting elements ED may be aligned on the electrodes RME1 and RME2 by a dielectrophoretic force due to the electric field generated on electrode lines.

Each of the first electrode RME1 and the second electrode RME2 may include a conductive material having high reflectivity. For example, each of the first electrode RME1 and the second electrode RME2 may include a metal such as silver (Ag), copper (Cu), or aluminum (Al) as a material having high reflectivity or may be an alloy including aluminum (Al), nickel (Ni), or lanthanum (La).

However, the disclosure is not limited thereto, and each of the first electrode RME1 and the second electrode RME2 may further include a transparent conductive material. For example, each of the first electrode RME1 and the second electrode RME2 may include a material such as ITO, IZO, or ITZO. In some embodiments, each of the first electrode RME1 and the second electrode RME2 may have a structure in which a transparent conductive material and a metal layer having high reflectivity are each stacked in one or more layers or may be formed as a single layer including them. For example, each of the first electrode RME1 and the second electrode RME2 may have a stacked structure of ITO/Ag/ITO, ITO/Ag/IZO, or ITO/Ag/ITZO/IZO.

A first insulating layer PAS1 may be disposed on the first electrode RME1 and the second electrode RME2. The first insulating layer PAS1 may entirely cover the first electrode RME1 and the second electrode RME2 and may protect the first electrode RME1 and the second electrode RME2 while insulating them from each other. The first insulating layer PAS1 may prevent the light emitting elements ED disposed on the first insulating layer PAS1 from being damaged by directly contacting other members.

In an embodiment, the first insulating layer PAS1 may have a stepped structure having a height difference such that a portion of an upper surface of the first insulating layer PAS1 is recessed between the first electrode RME1 and the second electrode RME2 spaced apart from each other in the second direction DR2. The light emitting elements ED may be disposed on the stepped upper surface of the first insulating layer PAS1, and a space may be formed between each of the light emitting elements ED and the first insulating layer PAS1. However, the disclosure is not limited thereto.

The first insulating layer PAS1 may include contact portions CT1 and CT2 partially exposing portions of upper surfaces of the first and second electrodes RME1 and RME2. The contact portions CT1 and CT2 may penetrate the first insulating layer PAS1, and the contact electrodes CNE1 and CNE2 described below may electrically contact the first and second electrodes RME1 and RME2 exposed through the contact portions CT1 and CT2, respectively.

The first bank BNL1 may be disposed on the first insulating layer PAS1. The first bank BNL1 may include portions extending in the first direction DR1 and the second direction DR2 to form a lattice pattern in a plan view. According to an embodiment, the first bank BNL1 may have a predetermined height to separate each area from another. For example, the first bank BNL1 may be disposed at the boundary of each subpixel PXn to separate neighboring subpixels PXn. The first bank BNL1 may surround the emission area EMA and the subarea SA disposed in each subpixel PXn to separate them from each other.

The first bank BNL1 may prevent ink from overflowing to adjacent subpixels PXn in an inkjet printing process during the fabrication process of the display device 10. The first bank BNL1 may prevent different inks including different light emitting elements ED dispersed in different subpixels PXn from being mixed with each other. The first bank BNL1 may be made of (or include) polyimide, but the embodiments are not limited thereto.

Of the portions of the first bank BNL1 which extend in the first direction DR1, a portion disposed between the emission areas EMA may be wider than a portion disposed between the subareas SA, and a distance between the subareas SA may be smaller than a distance between the emission areas EMA. However, the disclosure is not limited thereto, and on the contrary, the width of the first bank BNL1 may also be changed so that the distance between the subareas SA is greater than that between the emission areas EMA.

The light emitting elements ED may be disposed on the first insulating layer PAS1. The light emitting elements ED may be spaced apart from each other in the first direction DR1 in which each of the electrodes RME1 and RME2 extends, and may be aligned substantially parallel to each other. The light emitting elements ED may extend in a direction, and the direction in which each of the electrodes RME1 and RME2 extends and the direction in which the light emitting elements ED extend may be substantially perpendicular to each other. However, the disclosure is not limited thereto, and the light emitting elements ED may also extend obliquely to the direction in which each of the electrodes RME1 and RME2 extends.

Each light emitting element ED may include semiconductor layers doped with dopants of different conductivity types. Each light emitting element ED including the semiconductor layers may be oriented such that an end faces a specific direction according to the direction of an electric field generated on the electrodes RME1 and RME2. Each light emitting element ED may include a light emitting layer 36 (see FIG. 9) to emit light of a specific wavelength band. The light emitting elements ED disposed in each subpixel PXn may emit light of different wavelength bands depending on the material that forms the light emitting layer 36. According to an embodiment, the light emitting elements ED disposed in different subpixels PXn may emit light of different colors by including different light emitting layers 36.

Each light emitting element ED may include layers disposed in a direction parallel to an upper surface of the first substrate SUB. The direction in which the light emitting elements ED of the display device 10 extend may be parallel to the first substrate SUB, and semiconductor layers included in each light emitting element ED may be sequentially disposed in the direction parallel to the upper surface of the first substrate SUB. However, the disclosure is not limited thereto. In some embodiments, in case that the light emitting elements ED have a different structure, the layers may be disposed in a direction perpendicular to the first substrate SUB.

The light emitting elements ED may be disposed on the electrodes RME1 and RME2 spaced apart in the second direction DR2. A length of each light emitting element ED may be greater than the distance between the first electrode RME1 and the second electrode RME2, and ends of each light emitting element ED may be disposed on different electrodes.

Each light emitting element ED may include semiconductor layers, and a first end of the light emitting element ED and a second end opposite the first end may be defined based on a semiconductor layer. Each light emitting element ED may be disposed such that each of the first end and the second end lies on a specific electrode RME1 or RME2. For example, the light emitting elements ED may be disposed such that the first ends lie on the first electrode RME1 and the second ends lie on the second electrode RME2. However, the disclosure is not limited thereto, and the light emitting elements ED may also be disposed such that only an end of each light emitting element ED lies on an electrode RME1 or RME2 according to the direction in which the light emitting elements ED are oriented between the electrodes RME1 and RME2.

Two ends of each light emitting element ED may electrically contact the contact electrodes CNE1 and CNE2, respectively. An insulating film 38 (see FIG. 9) may not be formed on end surfaces of each light emitting element ED in an extending direction of the light emitting element ED, thereby partially exposing the semiconductor layers. The exposed semiconductor layers may electrically contact the contact electrodes CNE1 and CNE2. However, the disclosure is not limited thereto. In some embodiments, at least a portion of the insulating film 38 of each light emitting element ED may be removed to partially expose side surfaces of ends of the semiconductor layers. The exposed side surfaces of the semiconductor layers may directly contact the contact electrodes CNE1 and CNE2. Each light emitting element ED may be electrically connected to each electrode RME1 or RME2 or another light emitting element ED through a contact electrode CNE1 or CNE2.

A second insulating layer PAS2 may be disposed on a portion of the first insulating layer PAS1. For example, the second insulating layer PAS2 may be disposed on a portion of the first insulating layer PAS1 excluding a portion on which the light emitting elements ED are disposed. For example, the second insulating layer PAS2 may be entirely disposed on the first insulating layer PAS1 but may expose the light emitting elements ED. The second insulating layer PAS2 may have an opening that exposes at least two ends of each light emitting element ED, and the opening may also expose the contact portions CT1 and CT2 formed in the first insulating layer PAS1. In some embodiments, a width of the opening of the second insulating layer PAS2 may be equal to a distance between outermost sidewalls of different contact portions CT1 and CT2 of the first insulating layer PAS1. Sidewalls of a portion in which the opening of the second insulating layer PAS2 is formed may be aligned with sidewalls of portions in which the contact portions CT1 and CT2 of the first insulating layer PAS1 are formed. Although FIG. 4 illustrates that the second insulating layer PAS2 exposes ends of each light emitting element ED and an upper surface of each light emitting element ED in the cross section in the drawings, the disclosure is not limited thereto. In some embodiments, the second insulating layer PAS2 may expose only two ends of each light emitting element ED and may be disposed on a portion of the upper surface of each light emitting element ED in a cross-sectional view.

The second insulating layer PAS2 may be disposed on the first bank BNL1 while filling a space between each light emitting element ED and the first insulating layer PAS1 disposed under each light emitting element ED. This shape of the second insulating layer PAS2 may be obtained by entirely placing the second insulating layer PAS2 on the first insulating layer PAS1 during the fabrication process of the display device 10 and partially removing the second insulating layer PAS2 to form the opening.

Contact electrodes CNE, for example contact electrodes CNE1 and CNE2, may be disposed on the second insulating layer PAS2. Each of the contact electrodes CNE1 and CNE2 may electrically contact an end of each light emitting element ED and at least one electrode RME1 or RME2. For example, each of the contact electrodes CNE1 and CNE2 may electrically contact an exposed end of each light emitting element ED on which the second insulating layer PAS2 is not disposed, and may electrically contact at least one of the electrodes RME1 and RME2 through a contact portion CT1 or CT2 formed in the first insulating layer PAS1 to expose a portion of the electrode RME1 or RME2.

A first contact electrode CNE1 and a second contact electrode CNE2 may be disposed on the first electrode RME1 and the second electrode RME2, respectively. Each of the first contact electrode CNE1 and the second contact electrode CNE2 may extend in the first direction DR1 and may form a linear pattern in the emission area EMA of each subpixel PXn. The first contact electrode CNE1 may electrically contact the first electrode RME1 through a first contact portion CT1 exposing an upper surface of the first electrode RME1, and the second contact electrode CNE2 may electrically contact the second electrode RME2 through a second contact portion CT2 exposing an upper surface of the second electrode RME2. The first contact electrode CNE1 may electrically contact the first ends of the light emitting elements ED, and the second contact electrode CNE2 may electrically contact the second ends of the light emitting elements ED. Each of the first contact electrode CNE1 and the second contact electrode CNE2 may transfer an electrical signal transmitted to a corresponding one of the first electrode RME1 and the second electrode RME2, to an end of each light emitting element ED.

Although FIG. 3 illustrates that each of the contact electrodes CNE1 and CNE2 is disposed in a subpixel PXn, the disclosure is not limited thereto. The number and shape of the contact electrodes CNE1 and CNE2 may vary according to the number of electrodes RME1 and RME2 disposed in each subpixel PXn.

The contact electrodes CNE1 and CNE2 may include a conductive material such as ITO, IZO, ITZO, or aluminum (Al). For example, the contact electrodes CNE1 and CNE2 may include a transparent conductive material, and light emitted from the light emitting elements ED may pass through the contact electrodes CNE1 and CNE2 and proceed toward the electrodes RME1 and RME2, but the disclosure is not limited thereto.

Although not illustrated in the drawings, another insulating layer may be further disposed on the contact electrodes CNE1 and CNE2 to cover or overlap them. The insulating layer may be entirely disposed on the first substrate SUB to protect the members disposed on the first substrate SUB from the external environment.

Each of the first insulating layer PAS1 and the second insulating layer PAS2 described above may include, but is not limited to, an inorganic insulating material or an organic insulating material.

The display device 10 according to the embodiment may include different types of light emitting elements ED, for example, light emitting elements ED1 to ED3, in different subpixels PXn, and the arrangement of the electrodes RME1 and RME2 may be different in each subpixel PXn.

Figure 5:
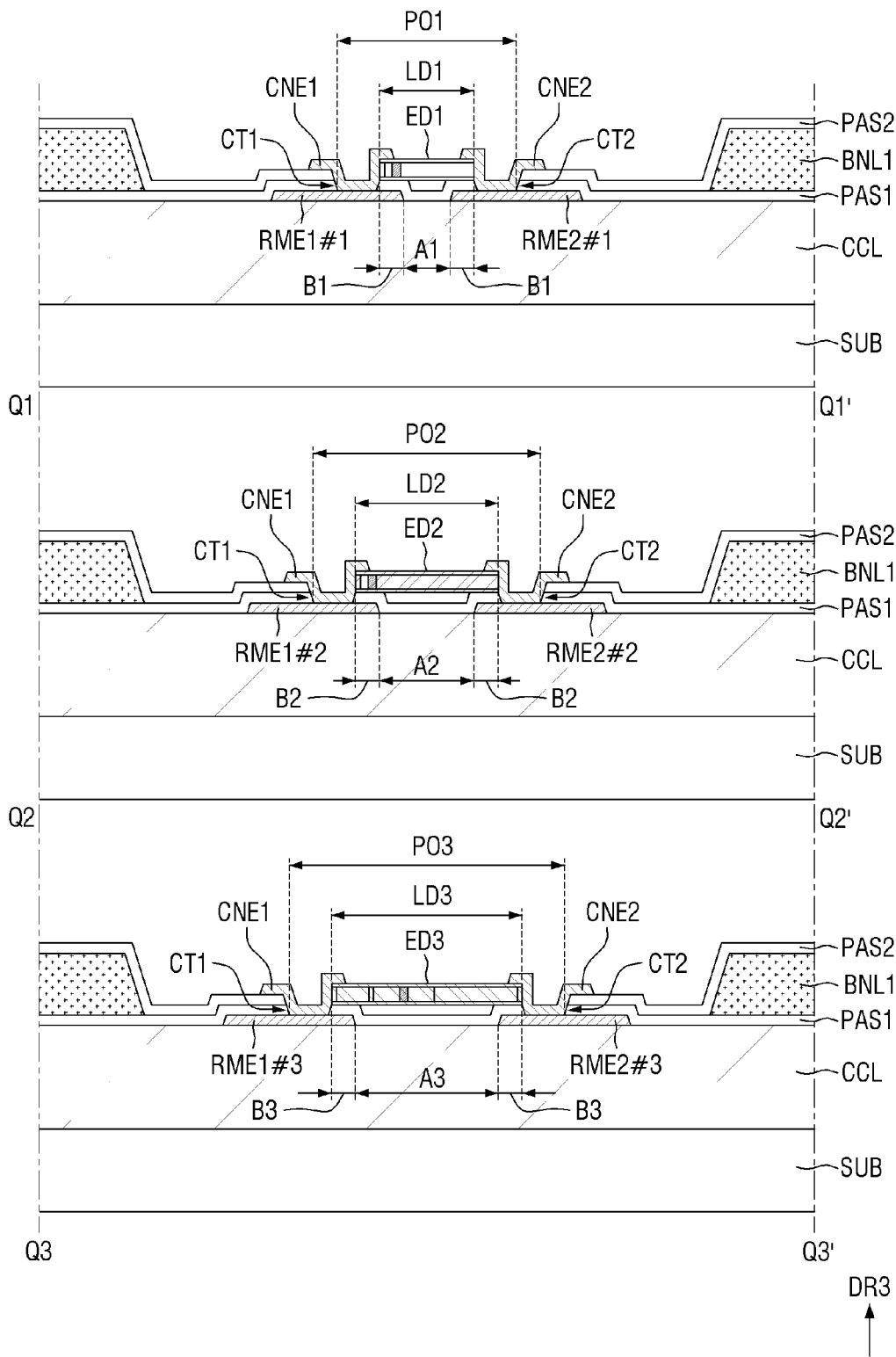
FIG. 5 is a schematic cross-sectional view taken along lines Q1-Q1', Q2-Q2', and Q3-Q3' of FIG. 2.

FIG. 5 is a schematic cross-sectional view taken along lines Q1-Q1', Q2-Q2', and Q3-Q3' of FIG. 2. FIG. 5 illustrates cross sections across ends of different light emitting elements ED, for example, light emitting elements ED1 to ED3, disposed in different subpixels PXn, for example, subpixels PX1, PX2, and PX3.

Referring to FIGS. 2 to 4 and 5, the display device 10 according to the embodiment may include subpixels PXn, each including electrodes RME1 and RME2 extending in the first direction DR1 and spaced apart from each other in the second direction DR2 and light emitting elements ED disposed on the electrodes RME1 and RME2, and the subpixels PXn may include the subpixels PX1 to PX3 in which the light emitting elements ED have different lengths.

For example, the first light emitting elements ED1 having a first length LD1 in their extending direction may be disposed in the first subpixel PX1. Second light emitting elements ED2 having a second length LD2 may be disposed in the second subpixel PX2, and third light emitting elements ED3 having a third length LD3 may be disposed in the third subpixel PX3. In an embodiment, the first light emitting elements ED1 may be shorter than the second light emitting elements ED2, and the second light emitting elements ED2 may be shorter than the third light emitting elements ED3. For example, the first length LD1 may be smaller than the second length LD3 and the third length LD3, and the second length LD2 may be smaller than the third length LD3.

As described above, the subpixels PXn may emit light of different colors. Since the display device 10 includes the light emitting elements ED, for example light emitting elements ED1 to ED3, emitting light of different colors, the subpixels PXn may emit light of different colors. Different types of light emitting elements ED may have different lengths LD1 to LD3, and the light emitting elements ED disposed in each subpixel PXn may be distinguished by their length and the color of emitted light.

The light emitting elements ED may be disposed on different electrodes RME1 and RME2 spaced apart from each other in the second direction DR2. Since the light emitting elements ED1 to ED3 having different lengths are disposed in different subpixels PXn, the electrodes RME1 and RME2 disposed in different subpixels PXn may be spaced apart from each other by different distances in the second direction DR2. For example, a first electrode RME1 #1 and a second electrode RME2 #1 of the first subpixel PX1 may be spaced apart from each other in the second direction DR2 by a first distance A1. The first distance A1 between the first electrode RME1 #1 and the second electrode RME2 #1 of the first subpixel PX1 may be smaller than the first length LD1 so that ends of each first light emitting element ED1 lie on the electrodes RME1 #1 and RME2 #1. The first ends of the first light emitting elements ED1 may partially overlap the first electrode RME1 #1 in the thickness direction, and the second ends of the first light emitting elements ED1 may partially overlap the second electrode RME2 #1 in the thickness direction. The first electrode RME1 #1 may include a portion overlapping the first light emitting elements ED1, and the second electrode RME2 #1 may include a portion overlapping the first light emitting elements ED1. Here, first widths B1 of the portions of the first electrode RME1 #1 and the second electrode RME2 #1 which overlap the first light emitting elements ED1 may be equal to each other. For example, the first length LD1 of each first light emitting element ED1 may be equal to the sum (A1+2B1) of the first distance A1 between the first electrode RME1 #1 and the second electrode RME2 #1 of the first subpixel PX1 and twice the first width B1.

The second length LD2 of each second light emitting element ED2 of the second subpixel PX2 may be greater than the first length LD1 of each first light emitting element ED1, and the arrangement of electrodes RME1 #2 and RME2 #2 of the second subpixel PX2 may vary according to the lengths of the second light emitting elements ED2. According to an embodiment, in the display device 10, the first and second electrodes RME1 and RME2 disposed in different subpixels PXn may have a same width, and widths B1 to B3 of portions overlapping the light emitting elements ED may also be substantially equal to each other. The electrodes RME1 #2 and RME2 #2 of the second subpixel PX2 and the electrodes RME1 #1 and RME2 #1 of the first subpixel PX1 may have a same width, and second widths B2 of portions overlapping the second light emitting elements ED2 may be equal to the first widths B1 of the electrodes RME1 #1 and RME2 #1 of the first subpixel PX1. Accordingly, in an embodiment, a second distance A2 between the electrodes RME1 #2 and RME2 #2 of the second subpixel PX2 may be greater than the first distance A1 of the first subpixel PX1 so that ends of the second light emitting elements ED2 having a different length from that of the first light emitting elements ED1 overlap the electrodes RME1 #2 and RME2 #2 by the second width B2. The second length LD2 of each second light emitting element ED2 may be equal to the sum (A2+2B2) of the second distance A2 between the first electrode RME1 #2 and the second electrode RME2 #2 of the second subpixel PX2 and twice the second width B2. Since the first width B1 and the second width B2 are equal, the second distance A2 may be greater than the first distance A1 by a difference between the second length LD2 of each second light emitting element ED2 and the first length LD1 of each first light emitting element ED1. In some embodiments, the second length LD2 of each second light emitting element ED2 may be greater than the first length LD1 of each first light emitting element ED1 by twice the second width B2. Accordingly, the second distance A2 between the electrodes RME1 #2 and RME2 #2 of the second subpixel PX2 may be greater than the first distance A1 by twice the second width B2, and the first length LD1 of each first light emitting element ED1 may be equal to the second distance A2 of the second subpixel PX2.

Similarly, a third distance A3 between a first electrode RME1 #3 and a second electrode RME2 #3 of the third subpixel PX3 may be greater than the second distance A2 and may be equal to the second length LD2 of each second light emitting element ED2. The third length LD3 of each third light emitting element ED3 may be equal to the sum (A3+2B3) of the third distance A3 between the electrodes RME1 #3 and RME2 #3 of the third subpixel PX3 and twice a third width B3. The third length LD3 of each third light emitting element ED3 may be greater than the second length LD2 of each second light emitting element ED2 by twice the third width B3.

The first and second electrodes RME1 and RME2 disposed in different subpixels PX1 to PX3 may have different distances A1 to A3 between them while maintaining a constant width. The distance A1, A2, or A3 between the electrodes RME1 and RME2 may vary according to the lengths of the light emitting elements ED disposed in a corresponding subpixel PXn. Even if the light emitting elements ED are disposed in a different subpixel PXn, at least one of both ends of the light emitting elements ED may not lie on the electrodes RME1 and RME2.

The positions of the contact portions CT1 and CT2 formed in the first insulating layer PAS1 may vary according to the lengths LD1, LD2, or LD3 of the light emitting elements ED1, ED2, or ED3. For example, a distance in the second direction DR2 between the contact portions CT1 and CT2 formed in the first subpixel PX1 may be smaller than a distance between the contact portions CT1 and CT2 formed in the second subpixel PX2. The distance between the contact portions CT1 and CT2 formed in the second subpixel PX2 may be smaller than the distance between the contact portions CT1 and CT2 formed in the third subpixel PX3. The contact portions CT1 and CT2 may expose the upper surfaces of the electrodes RME1 and RME2 but may be formed at positions not covered or overlapped by the light emitting elements ED. For example, if the distance in the second direction DR2 between the first contact portion CT1 and the second contact portion CT2 formed in the first subpixel PX1 is smaller than the first length LD1 of each first light emitting element ED1, at least one of the contact portions CT1 and CT2 or the contact portions CT1 and CT2 may be partially covered or overlapped by the first light emitting elements ED1. To prevent this, the positions of the contact portions CT1 and CT2 formed in the first insulating layer PAS1 may vary according to the length of each light emitting element ED.

The second insulating layer PAS2 may have openings formed therein to expose the light emitting elements ED, and the openings may be formed to expose the contact portions CT1 and CT2. In an embodiment in which sidewalls of the openings are aligned with sidewalls of the contact portions CT1 and CT2 of the first insulating layer PAS1, the openings formed in the second insulating layer PAS2 of the display device 10 may have different opening widths PO1 to PO3 in different subpixels PX1 to PX3, respectively. For example, a first opening width PO1 of an opening formed in the second insulating layer PAS2 of the first subpixel PX1 may be greater than the length of each first light emitting element ED1, and a second opening width PO2 of an opening formed in the second insulating layer PAS2 of the second subpixel PX2 may be greater than the length of each second light emitting element ED2. For example, the first opening width PO1 of the first subpixel PX1 may be smaller than the second opening width PO2 of the second subpixel PX2. Similarly, the second opening width PO2 of the second subpixel PX2 may be smaller than a third opening width PO3 of the third subpixel PX3.

Since the opening of the second insulating layer PAS2 formed in each subpixel PXn has a different width according to the length LD1, LD2 or LD3 of each light emitting element ED disposed in the subpixel PXn, only specific light emitting elements ED may be electrically connected through the contact electrodes CNE1 and CNE2 in the subpixel PXn. The second insulating layer PAS2 may be a layer disposed on the light emitting elements ED, and the opening may be formed to expose at least both ends of each light emitting element ED. The opening of each subpixel PXn may have a width designed according to the light emitting elements ED disposed in the subpixel PXn. In some embodiments, the width of the opening of the second insulating layer PAS2 may be designed such that even if light emitting elements ED having a length greater than the designed width of the opening are disposed, both ends of the light emitting elements ED do not electrically contact the contact electrodes CNE1 and CNE2.

In the display device 10 according to the embodiment, the light emitting elements ED1 to ED3 emitting light of different colors may have different lengths LD1 to LD3, respectively. Accordingly, the subpixels PX1 to PX3 emitting light of different colors may have different distances A1 to A3 between the electrodes RME1 and RME2, respectively. In some embodiments, the display device 10 may be fabricated by performing an inkjet printing process of spraying ink, in which the light emitting elements ED are dispersed, onto the electrodes RME1 and RME2. Ink including light emitting elements ED of a different type may be sprayed onto each subpixel PXn. Even if the ink overflows to other subpixels PXn or is sprayed to a wrong position, the light emitting elements ED may not be electrically connected to the electrodes RME1 and RME2.

Figure 6:
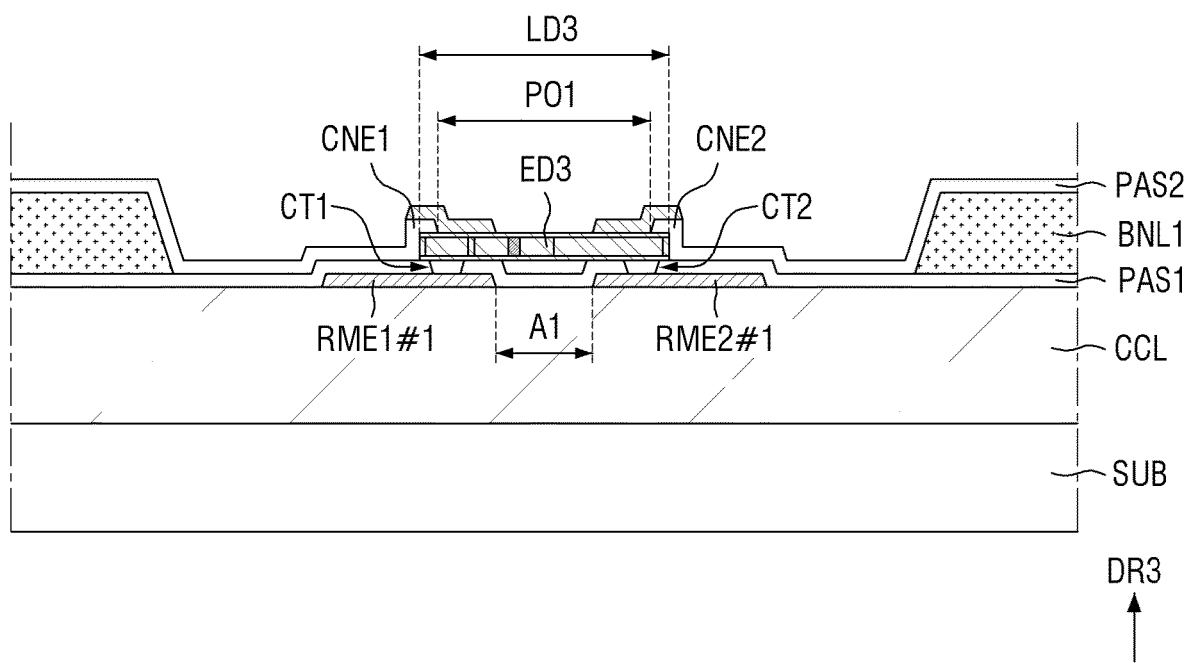
FIGS. 6 and 7 are schematic partial cross-sectional views of the display device according to the embodiment.
Figure 7:
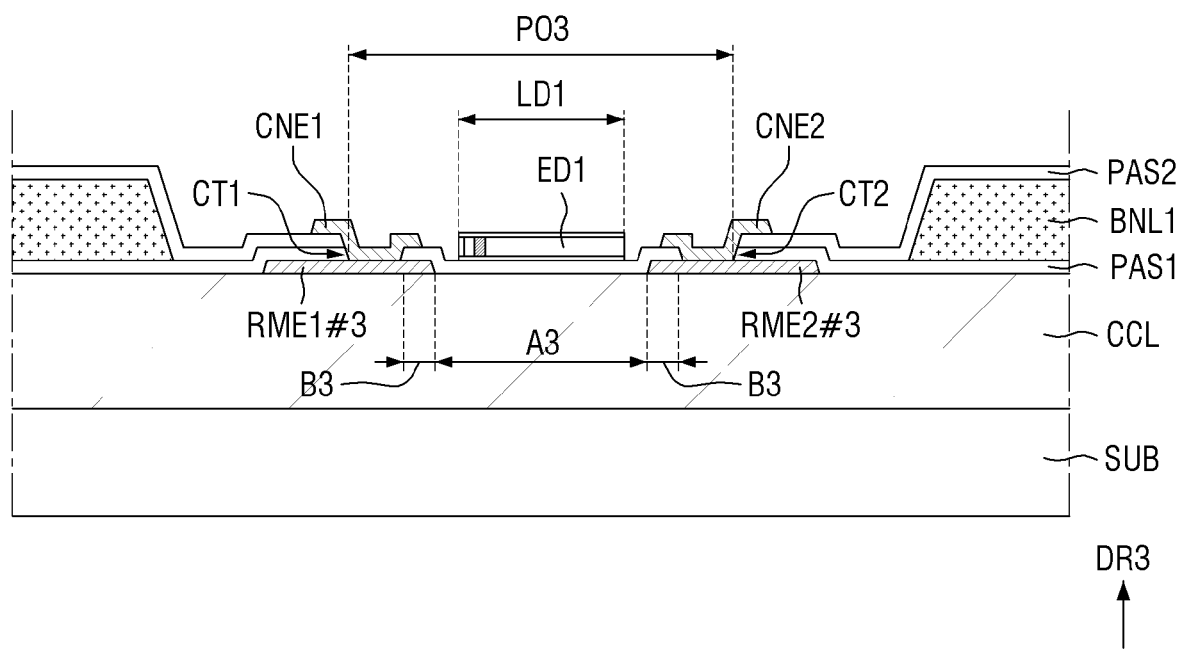

FIGS. 6 and 7 are schematic partial cross-sectional views of the display device 10 according to the embodiment. FIG. 6 illustrates a case where a third light emitting element ED3 is disposed on the electrodes RME1 #1 and RME2 #1 of the first subpixel PX1, and FIG. 7 illustrates a case where a first light emitting element ED1 is disposed on the electrodes RME1 #3 and RME2 #3 of the third subpixel PX3.

First, referring to FIG. 6, the distance between the first electrode RME1 #1 and the second electrode RME2 #1 of the first subpixel PX1 may be the first distance A1 designed according to the first length LD1 of the first light emitting element ED1. The contact portions CT1 and CT2 of the first insulating layer PAS1 may be formed at positions designed according to the first length LD1 of the first light emitting element ED1, and the opening of the second insulating layer PAS2 may have the first opening width PO1 designed according to the first length LD1 of the first light emitting element ED1. If the third light emitting element ED3 having the third length LD3 is disposed in the first subpixel PX1 designed to have the first distance A1 and the first opening width PO1, ends of the third light emitting element ED3 may lie on the first electrode RME1 #1 and the second electrode RME2 #1 because the third length LD3 is greater than the first distance A1. However, the third light emitting element ED3 may cover or overlap the contact portions CT1 and CT2 of the first insulating layer PAS1, and the third length LD3 may be greater than the first opening width PO1. Therefore, ends of the third light emitting element ED3 may be covered or overlapped by the second insulating layer PAS2. Since both ends of the third light emitting element ED3 disposed in the first subpixel PX1 do not electrically contact the contact electrodes CNE1 and CNE2, the third light emitting element ED3 may not be electrically connected to the electrodes RME1 and RME2 and may not emit light.

Conversely, referring to FIG. 7, the distance between the first electrode RME1 #3 and the second electrode RME2 #3 of the third subpixel PX3 may be the third distance A3 designed according to the third length LD3 of the third light emitting element ED3. The contact portions CT1 and CT2 of the first insulating layer PAS1 may be formed at positions designed according to the third length LD3 of the third light emitting element ED3, and the opening of the second insulating layer PAS2 may have the third opening width PO3 designed according to the third length LD3 of the third light emitting element ED3. If the first light emitting element ED1 having the first length LD1 is disposed in the third subpixel PX3 designed to have the third distance A3 and the third opening width PO3, ends of the first light emitting element ED1 may not lie on the first electrode RME1 #3 and the second electrode RME2 #3 because the first length LD1 is smaller than the third distance A3. The distance between the contact portions CT1 and CT2 of the first insulating layer PAS1 and the third opening width PO3 of the second insulating layer PAS2 may be greater than the first length LD1 of the first light emitting element ED1, and the contact electrodes CNE1 and CNE2 may not electrically contact the first light emitting element ED1. Since ends of the first light emitting element ED1 disposed in the third subpixel PX3 do not electrically contact the contact electrodes CNE1 and CNE2, the first light emitting element ED1 may not be electrically connected to the electrodes RME1 and RME2 and may not emit light.

In particular, the width of the opening of the second insulating layer PAS2 may be designed such that only corresponding light emitting elements ED are electrically connected to the electrodes RME1 and RME2 through the contact electrodes CNE1 and CNE2 in each subpixel PXn. If both ends of the light emitting elements ED are not exposed by adjusting the opening width PO1, PO2 or PO3 of the second insulating layer PAS2, it is possible to prevent light emitting elements ED, disposed in other subpixels PXn, from electrically contacting the contact electrodes CNE1 and CNE2.

Figure 8:
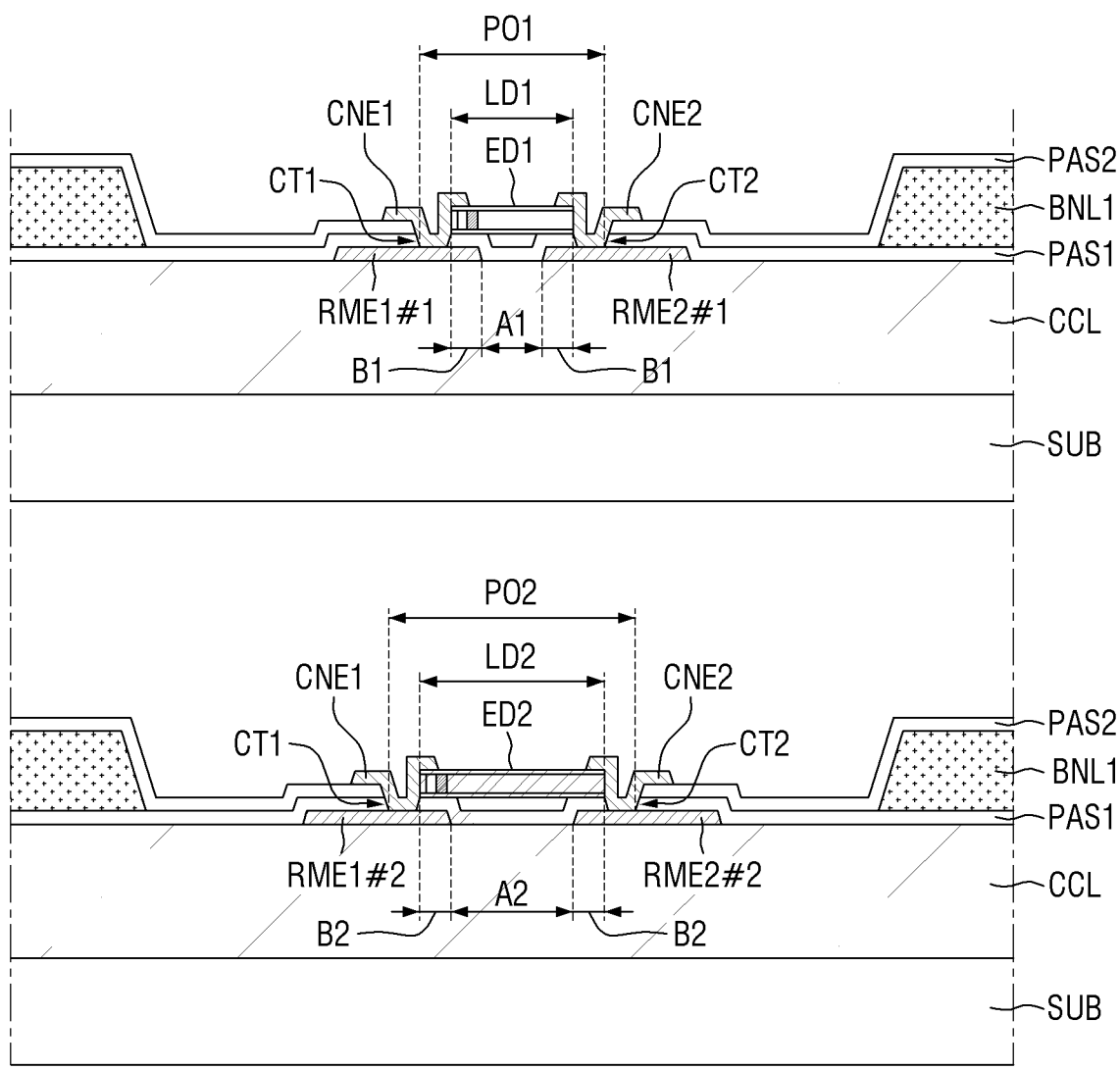
FIG. 8 is a schematic partial cross-sectional view of the display device according to the embodiment.

FIG. 8 is a schematic partial cross-sectional view of the display device 10 according to the embodiment. FIG. 8 illustrates cross sections across both ends of a first light emitting element ED1 and a second light emitting element ED2 disposed in the first subpixel PX1 and the second subpixel PX2, respectively.

Referring to FIG. 8, according to an embodiment, the width of an opening of the second insulating layer PAS2 in the display device 10 may be designed such that even if a light emitting element ED having a length greater than the designed width of the opening is disposed, ends of the light emitting element ED do not electrically contact the contact electrodes CNE1 and CNE2.

For example, in the display device 10, the first opening width PO1 of an opening formed in the second insulating layer PAS2 of the first subpixel PX1 may be greater than the first length LD1 of a first light emitting element ED1 and be equal to the second length LD2 of a second light emitting element ED2. If the second light emitting element ED2 is disposed in the first subpixel PX1, ends of the second light emitting element ED2 may be covered or overlapped by the second insulating layer PAS2 because the first opening width PO1 of the opening of the second insulating layer PAS2 and the second length LD2 are equal. In an embodiment in which sidewalls of the opening of the second insulating layer PAS2 are aligned with the sidewalls of the contact portions CT1 and CT2 of the first insulating layer PAS1, the second light emitting element ED2 disposed in the first subpixel PX1 may cover or overlap the contact portions CT1 and CT2 of the first insulating layer PAS1 because the second length LD2 of the second light emitting element ED2 disposed in the first subpixel PX1 is equal to the first opening width PO1. Similarly, the second opening width PO2 of an opening formed in the second insulating layer PAS2 of the second subpixel PX2 may be greater than the second length LD2 of the second light emitting element ED2 and be equal to the third length LD3 of a third light emitting element ED3.

In the display device 10, light emitting elements ED, for example light emitting elements ED1 to ED3, emitting light of different colors may be disposed in different subpixels PXn and may have different lengths LD1 to LD3. In each subpixel PXn, the distance A1, A2, or A3 between the electrodes RME1 and RME2, the opening width PO1, PO2, or PO3 of the second insulating layer PAS2, and the distance between the contact portions CT1 and CT2 of the first insulating layer PAS1 may be designed according to the lengths LD1, LD2, or LD3 of the light emitting elements ED. Accordingly, even if ink sprayed during an inkjet printing process overflows to other subpixels PXn, only corresponding light emitting elements ED may be electrically connected to the electrodes RME1 and RME2 and emit light in each subpixel PXn.

Figure 9:
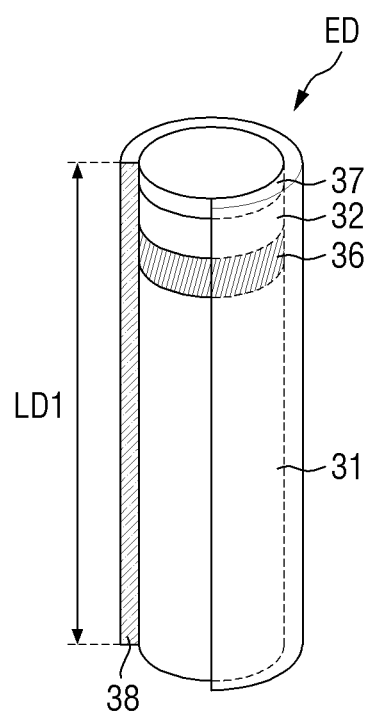
FIGS. 9 and 10 are schematic perspective views of light emitting elements according to embodiments.
Figure 10:
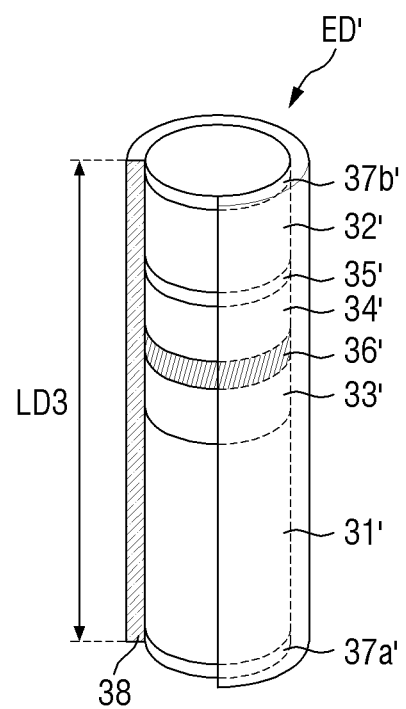

FIGS. 9 and 10 are schematic views of light emitting elements ED and ED' according to embodiments. FIG. 9 illustrates an example of a structure that a first light emitting element ED1 or a second light emitting element ED2 may have, and FIG. 10 illustrates an example of a structure that a third light emitting element ED3 may have.

Referring to FIGS. 9 and 10, a light emitting element ED may be a light emitting diode. Specifically, the light emitting element ED may be an inorganic light emitting diode having a size of nanometers to micrometers and be made of an inorganic material. In case that an electric field is formed in a specific direction between two electrodes facing each other, the light emitting element ED may be aligned between the two electrodes in which polarities are formed.

The light emitting element ED according to an embodiment may extend in a direction. The light emitting element ED may be shaped like a cylinder, a rod, a wire, a tube, or the like. However, the shape of the light emitting element ED is not limited thereto, and the light emitting element ED may also have various shapes including polygonal prisms, such as a cube, a rectangular parallelepiped, and a hexagonal prism, and a shape extending in a direction and having a partially inclined outer surface.

The light emitting element ED may include a semiconductor layer doped with impurities of a conductivity type (e.g., a p- or n-type). The semiconductor layer may receive an electrical signal from an external power source and emit light of a specific wavelength band. In the display device 10, the light emitting elements ED disposed in different subpixels PXn may have the structure illustrated in FIG. 9 or 10 and may have different lengths and emit light of different colors.

As an example of the structure that a first light emitting element ED1 and a second light emitting element ED2 may have, the light emitting element ED illustrated in FIG. 9 may include a first semiconductor layer 31, a second semiconductor layer 32, the light emitting layer 36, an electrode layer 37, and the insulating film 38.

The first semiconductor layer 31 may be an n-type semiconductor. The first semiconductor layer 31 may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer 31 may be one or more of AlGaInN, GaN, AlGaN, InGaN, AlN, and InN doped with is-type dopants. An is-type dopant used to dope the first semiconductor layer 31 may be Si, Ge, Sn, or the like. The first end of the light emitting element ED may be a portion in which the first semiconductor layer 31 is disposed with respect to the light emitting layer 36.

The second semiconductor layer 32 may be disposed on the first semiconductor layer 31 with the light emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \le x \le 1$, $0 \le y \le 1$, $0 \le x+y \le 1$). For example, the second semiconductor layer 32 may be one or more of AlGaInN, GaN, AlGaN, InGaN, AlN, and InN doped with p-type dopants. A p-type dopant used to dope the second semiconductor layer 32 may be Mg, Zn, Ca, Se, Ba, or the like. The second end of the light emitting element ED may be a portion in which the second semiconductor layer 32 is disposed with respect to the light emitting layer 36.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, it may have a structure in which quantum layers and well layers are alternately stacked. The light emitting layer 36 may emit light by combination or coupling of electron-hole pairs according to electrical signals received through the first semiconductor layer 31 and the second semiconductor layer 32. The light emitting layer 36 may include a material such as AlGaN or AlGaInN. In case that the light emitting layer 36 has a multiple quantum well structure in which a quantum layer and a well layer are alternately stacked, the quantum layer may include a material such as AlGaN or AlGaInN, and the well layer may include a material such as GaN or AlInN.

The light emitting layer 36 may also have a structure in which a semiconductor material having a large band gap energy and a semiconductor material having a small band gap energy are alternately stacked or may include different Group III to V semiconductor materials depending on the wavelength band of light that it emits. Light emitted from the light emitting layer 36 is not limited to light in a blue wavelength band, In some embodiments, the light emitting layer 36 may emit light in a red or green wavelength band.

The electrode layer 37 may be an ohmic contact electrode. However, the disclosure is not limited thereto, and the electrode layer 37 may also be a Schottky contact electrode.

The light emitting element ED may include at least one electrode layer 37. The light emitting element ED may include one or more electrode layers 37. However, the disclosure is not limited thereto, and the electrode layer 37 may be omitted.

In case that the light emitting element ED is electrically connected to an electrode or a contact electrode in the display device 10, the electrode layer 37 may reduce the resistance between the light emitting element ED and the electrode or the contact electrode. The electrode layer 37 may include a conductive metal. For example, the electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO).

The insulating film 38 may surround outer surfaces of the semiconductor layers and the electrode layers described above. For example, the insulating film 38 may surround an outer surface of at least the light emitting layer 36 but may expose ends of the light emitting element ED in a longitudinal direction. An upper surface of the insulating film 38 may be rounded in a cross-sectional view in an area adjacent to at least one end of the light emitting element ED.

The insulating film 38 may include a material having insulating properties such as silicon oxide ($SiO_x$), silicon nitride ($SiN_x$), silicon oxynitride ($SiO_xN_y$), aluminum nitride ($AlN_x$), or aluminum oxide ($AlO_x$). Although FIG. 9 illustrates that the insulating film 38 is formed as a single layer, the disclosure is not limited thereto. In some embodiments, the insulating film 38 may be formed in a multilayer structure in which layers are stacked.

The insulating film 38 may protect the abovementioned members (e.g., first semiconductor layer 31, the second semiconductor layer 32, the light emitting layer 36, and the electrode layer 37). The insulating film 38 may prevent an electrical short circuit that may occur in the light emitting layer 36 in case that the light emitting layer 36 directly contacts an electrode through which an electrical signal is transmitted to the light emitting element ED. The insulating film 38 may prevent a reduction in luminous efficiency of the light emitting element ED.

An outer surface of the insulating film 38 may be treated. Light emitting elements ED may be sprayed onto electrodes in a state where they are dispersed in an ink, and may be aligned. Here, the surface of the insulating film 38 may be hydrophobically or hydrophilically treated so that each light emitting element ED remains separate from other adjacent light emitting elements ED in the ink without agglomerating with each other.

As an example of the structure that a third light emitting element ED3 may have, the light emitting element ED' illustrated in FIG. 10 may further include a third semiconductor layer 33' disposed between a first semiconductor layer 31' and a light emitting layer 36' and a fourth semiconductor layer 34' and a fifth semiconductor layer 35' disposed between the light emitting layer 36' and a second semiconductor layer 32'. The light emitting element ED' may include electrode layers 37a' and 37b' disposed at its ends, respectively.

The light emitting element ED' of FIG. 10 may be a semiconductor in which each of the light emitting layer 36' and other semiconductor layers includes at least phosphorous (P). For example, the light emitting element ED' according to an embodiment may emit red light, a central wavelength band of which is in a range of about 620 nm to about 750 nm. However, the central wavelength band of the red light is not limited to the above range and should be understood to include all wavelength ranges that can be recognized as red in the art to which the disclosure pertains.

Specifically, the first semiconductor layer 31' may be an n-type semiconductor layer and may include a semiconductor material having a chemical formula of $In_xAl_yGa_{1-x-y}P$ ($0 \leq x \leq 1$, $0 \leq y \leq 1$, $0 \leq x+y \leq 1$). For example, the first semiconductor layer 31' may be one or more of InAlGaP, GaP, AlGaP, InGaP, AlP, and InP doped with n-type dopants.

The second semiconductor layer 32' may be a p-type semiconductor layer and may include a semiconductor material having a chemical formula of $In_xAl_yGa_{1-x-y}P$ ($0 \leq x \leq 1$, $0 \leq y \leq 1$, $0 \leq x+y \leq 1$). For example, the second semiconductor layer 32' may be one or more of InAlGaP, GaP, AlGaNP, InGaP, InGaP, AlP and InP doped with p-type dopants.

The light emitting layer 36' may be disposed between the first semiconductor layer 31' and the second semiconductor layer 32'. The light emitting layer 36' may include a material having a single or multiple quantum well structure to emit light of a specific wavelength band. In case that the light emitting layer 36' has a multiple quantum well structure in which a quantum layer and a well layer are alternately stacked, the quantum layer may include a material such as AlGaP or AlInGaP, and the well layer may include a material such as GaP or AlInP. In an embodiment, the light emitting layer 36' may include AlGaInP as the quantum layer and AlInP as the well layer to emit red light having a central wavelength band of about 620 nm to about 750 nm.

The light emitting element ED' of FIG. 10 may include a clad layer disposed adjacent to the light emitting layer 36'. The third semiconductor layer 33' and the fourth semiconductor layer 34' respectively disposed under and on the light emitting layer 36' and between the first semiconductor layer 31' and the second semiconductor layer 32' may be clad layers.

The third semiconductor layer 33' may be disposed between the first semiconductor layer 31' and the light emitting layer 36'. Similar to the first semiconductor layer 31', the third semiconductor layer 33' may be an n-type semiconductor. For example, the third semiconductor layer 33' may include a semiconductor material having a chemical formula of $In_xAl_yGa_{1-x-y}P$ ($0 \leq x \leq 1$, $0 \leq y \leq 1$, $0 \leq x+y \leq 1$). In an embodiment, the first semiconductor layer 31' may be n-AlGaInP, and the third semiconductor layer 33' may be n-AlInP.

The fourth semiconductor layer 34' may be disposed between the light emitting layer 36' and the second semiconductor layer 32'. Similar to the second semiconductor layer 32', the fourth semiconductor layer 34' may be an n-type semiconductor. For example, the fourth semiconductor layer 34' may include a semiconductor material having a chemical formula of $In_xAl_yGa_{1-x-y}P$ ($0 \leq x \leq 1$, $0 \leq y \leq 1$, $0 \leq x+y \leq 1$). In an embodiment, the second semiconductor layer 32' may be p-GaP, and the fourth semiconductor layer 34' may be p-AlInP.

The fifth semiconductor layer 35' may be disposed between the fourth semiconductor layer 34' and the second semiconductor layer 32'. Similar to the second semiconductor layer 32' and the fourth semiconductor layer 34', the fifth semiconductor layer 35' may be a semiconductor doped with p-type dopants. In some embodiments, the fifth semiconductor layer 35' may reduce a difference in the lattice constant between the fourth semiconductor layer 34' and the second semiconductor layer 32'. For example, the fifth semiconductor layer 35' may be a tensile strain barrier reducing (TSBR) layer. For example, the fifth semiconductor layer 35' may include, but is not limited to, p-GaInP, p-AlInP, or p-AlGaInP.

The first electrode layer 37a' and the second electrode layer 37b' may be disposed on surfaces of the first semiconductor layer 31' and the second semiconductor layer 32', respectively, The first electrode layer 37a' may be disposed on a lower surface of the first semiconductor layer 31', and the second electrode layer 37b' may be disposed on an upper surface of the second semiconductor layer 32'.

Other embodiments of the display device 10 will now be described with reference to other drawings.

Figure 11:
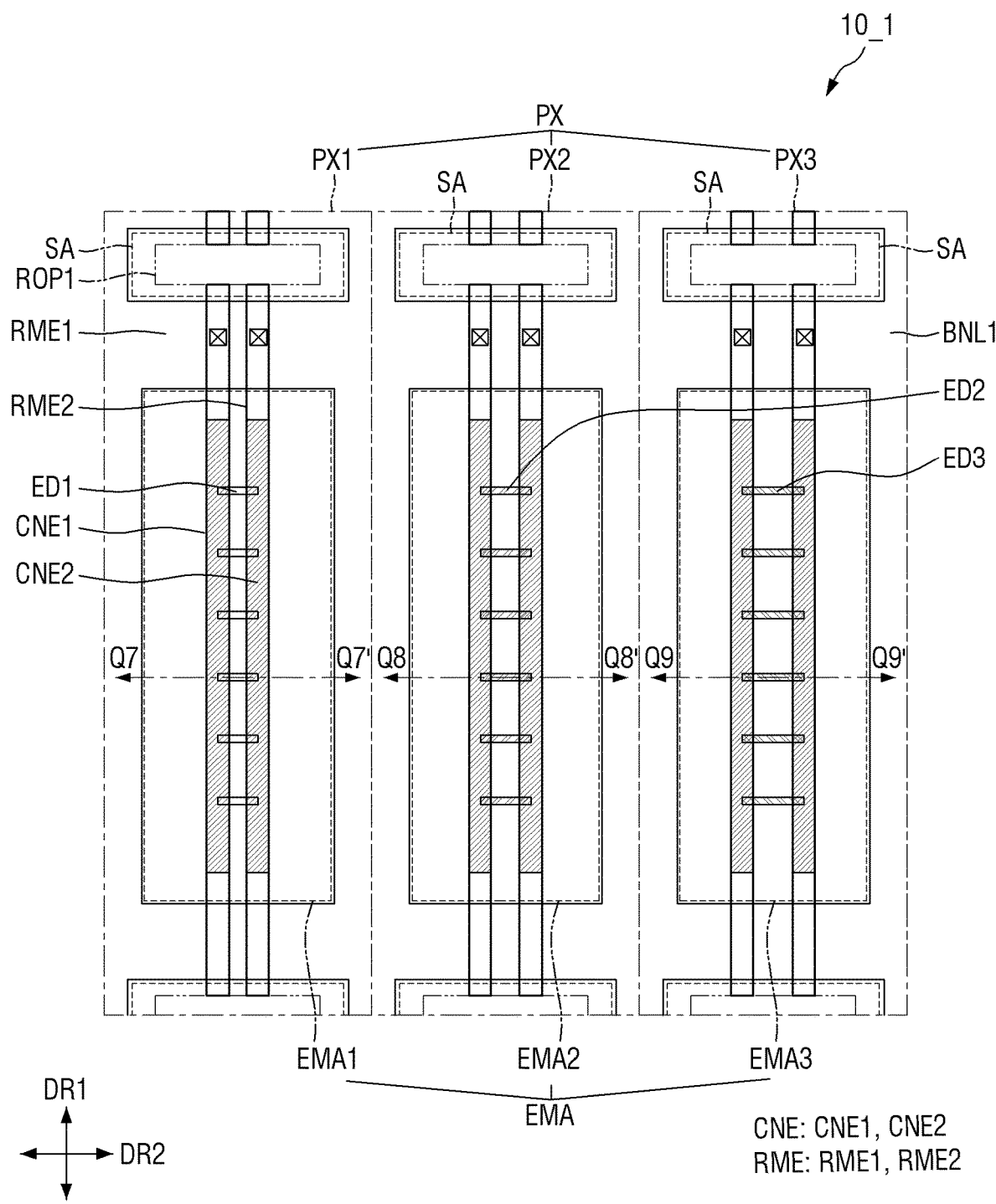
FIG. 11 is a schematic plan view of a pixel of a display device according to an embodiment.
Figure 12:
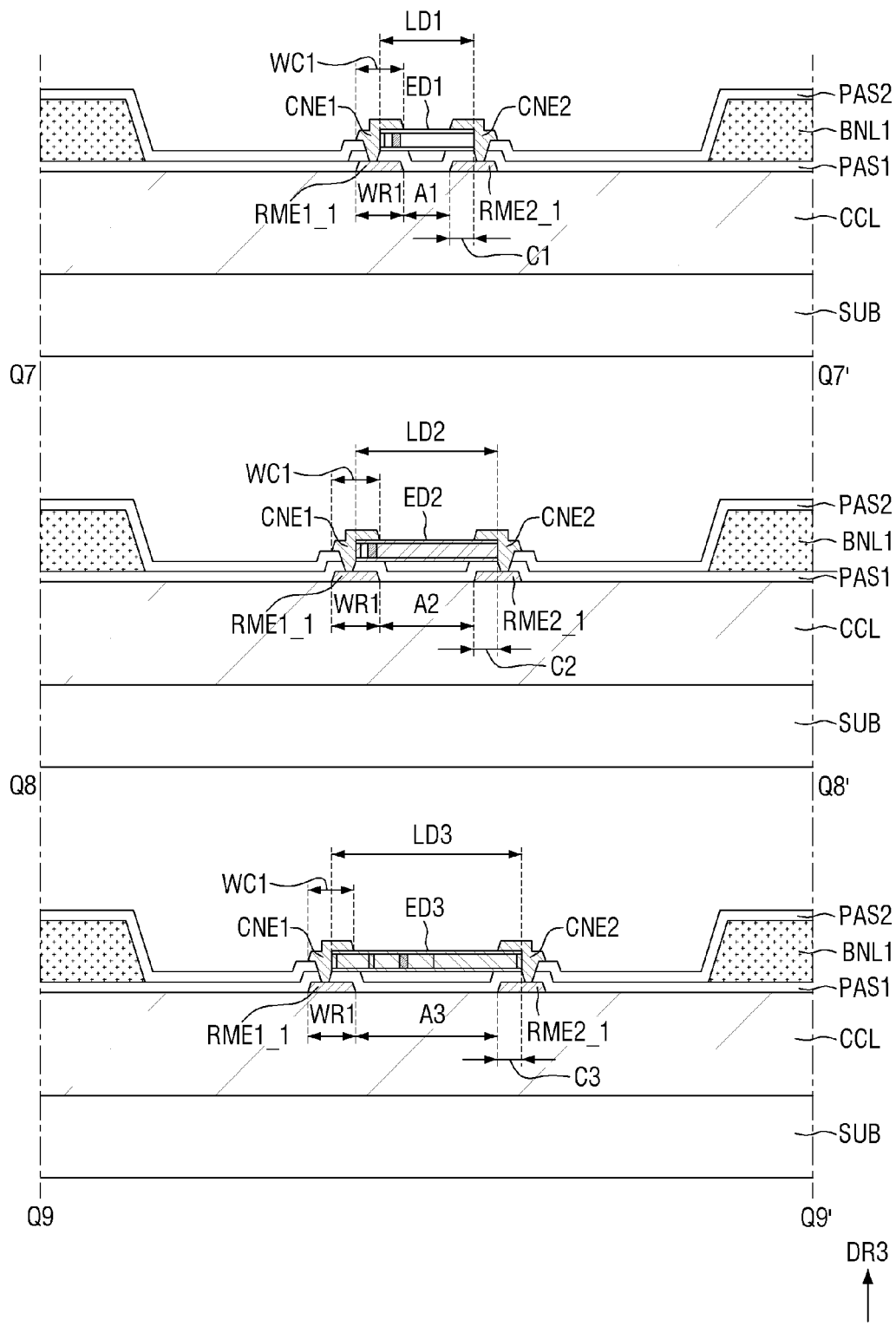
FIG. 12 is a schematic cross-sectional view taken along lines Q7-Q7', Q8-Q8', and Q9-Q9' of FIG. 11.

FIG. 11 is a schematic plan view of a pixel PX of a display device 10_1 according to an embodiment. FIG. 12 is a schematic cross-sectional view taken along lines Q7-Q7', Q8-Q8', and Q9-Q9' of FIG. 11.

Referring to FIGS. 11 and 12, in the display device 10_1 according to the embodiment, electrodes RME1_1 and RME2_1 and contact electrodes CNE1 and CNE2 may have a same width. In the display device 10_1, different types of light emitting elements ED may be disposed in different subpixels PXn, and structures of the electrodes RME1_1 and RME2_1 may be changed accordingly, In some embodiments, in the display device 10_1, the electrodes RME1_1 and RME2_1 and the contact electrodes CNE1 and CNE2 may have a same width, and widths WR1 of the electrodes RME1_1 and RME2_1 and a distance A1, A2, or A3 between the electrodes RME1_1 and RME2_1 may be designed according to a length LD1, LD2, or LD3 of the light emitting elements ED.

For example, a width WR1 of a first electrode RME1_1 may be equal to a width WC1 of a first contact electrode CNE1, and a width of the second electrode RME2_1 may be equal to a width of a second contact electrode CNE2, The distance A1, A2, or A3 between the first electrode RME1_1 and the second electrode RME2_1 and that of the embodiment of FIG. 5 may be the same. However, the width of each of the first electrode RME1_1 and the second electrode RME2_1 may vary according to a width C1, C2, or C3 of a portion overlapping the light emitting elements ED.

According to an embodiment, the width WR1 of each of the electrodes RME1_1 and RME2_1 of a first subpixel PX1 may be twice or more than twice the width C1 of a portion of the electrode RME1_1 or RME2_1 which overlaps first light emitting elements ED1. For example, ends of each first light emitting element ED1 may respectively overlap the first electrode RME1_1 and the second electrode RME2_1 by half the width (WR1/2) of each of the first electrode RME1_1 and the second electrode RME2_1. A difference (L2−L1) between a first length LD1 of each first light emitting element ED1 and a second length LD2 of each second light emitting element ED2 may be equal to the sum (2×C1) of the widths of the portions of the first electrode RME1_1 and the second electrode RME2_1 which overlap the first light emitting elements ED1, for example, may be equal to the width WR1 of each of the electrodes RME1_1 and RME2_1. A first distance A1 between the electrodes RME1_1 and RME2_1 of the first subpixel PX1 may be equal to a difference (LD1−WR1) between the first length LD1 of each first light emitting element ED1 and the sum (2×C1) of the widths of the portions of the first electrode RME1_1 and the second electrode RME2_1 which overlap the first light emitting elements ED1, for example, the width WR1 of each of the electrodes RME1_1 and RME2_1.

Similarly, a second distance A2 between the electrodes RME1_1 and RME2_1 of a second subpixel PX2 may be equal to a difference (LD2−WR1) between the second length LD2 of each second light emitting element ED2 and the width WR1 of each of the electrodes RME1_1 and RME2_1, and a third distance A3 between the electrodes RME1_1 and RME2_1 of a third subpixel PX3 may be equal to a difference (LD3−WR1) between a third length LD3 of each third light emitting element ED3 and the width WR1 of each of the electrodes RME1_1 and RME2_1.

Since the difference between the lengths LD1 to LD3 of different light emitting elements ED1 to ED3 is equal to the width WR1 of each of the electrodes RME1_1 and RME2_1, if a light emitting element ED corresponding to a subpixel PXn is disposed in another subpixel PXn, the light emitting element ED may have a length LD1, LD2, or LD3 that can cover or overlap all upper surfaces of the electrodes RME1_1 and RME2_1. In the display device 10_1, the width WR1 of each electrode RME1_1 or RME2_1 and the distance A1, A2, or A3 between the electrodes RME1_1 and RME2_1 may be designed according to the lengths of light emitting elements ED. Therefore, even if a light emitting element ED corresponding to another subpixel PXn is disposed, electrical connection can be prevented. However, the width WR1 of each of the electrodes RME1_1 and RME2_1 of each subpixel PXn may not be limited to twice the width C1 of a portion of the electrode RME1_1 or RME2_1 which overlaps the light emitting elements ED and may also be more than twice. For example, the width WR1 of each of the electrodes RME1_1 and RME2_1 may be two to three times the width C1 of the portion overlapping the light emitting elements ED. The width WR1 of each of the electrodes RME1_1 and RME21 in each subpixel PXn may be adjusted within a certain range as long as a light emitting element ED disposed in another subpixel PXn is not electrically connected to the electrodes RME1_1 and RME2_1 even if the light emitting element ED is disposed in the subpixel PXn.

Figure 13:
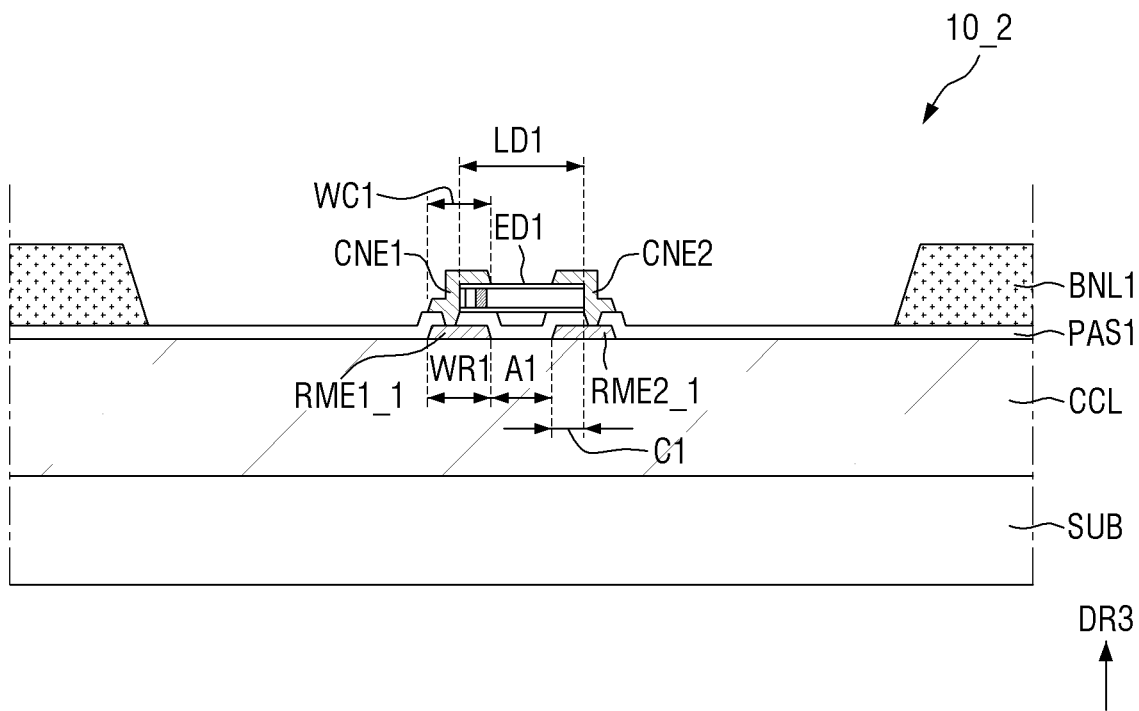
FIG. 13 is a schematic partial cross-sectional view of a display device according to an embodiment.

FIG. 13 is a schematic partial cross-sectional view of a display device 10_2 according to an embodiment.

Referring to FIG. 13, in the display device 10_2 according to the embodiment, a second insulating layer PAS2 may be omitted. The display device 10_2 according to the embodiment may be different from the embodiment of FIGS. 11 and 12 at least in that the second insulating layer PAS2 is omitted. Since electrodes RME1_1 and RME2_1 have a relatively small width WR1, light emitting elements ED may be aligned smoothly even if the second insulating layer PAS2 is omitted. Accordingly, each of a first contact electrode CNE1 and a second contact electrode CNE2 may be directly disposed on the light emitting elements ED and a first insulating layer PAS1.

Figure 14:
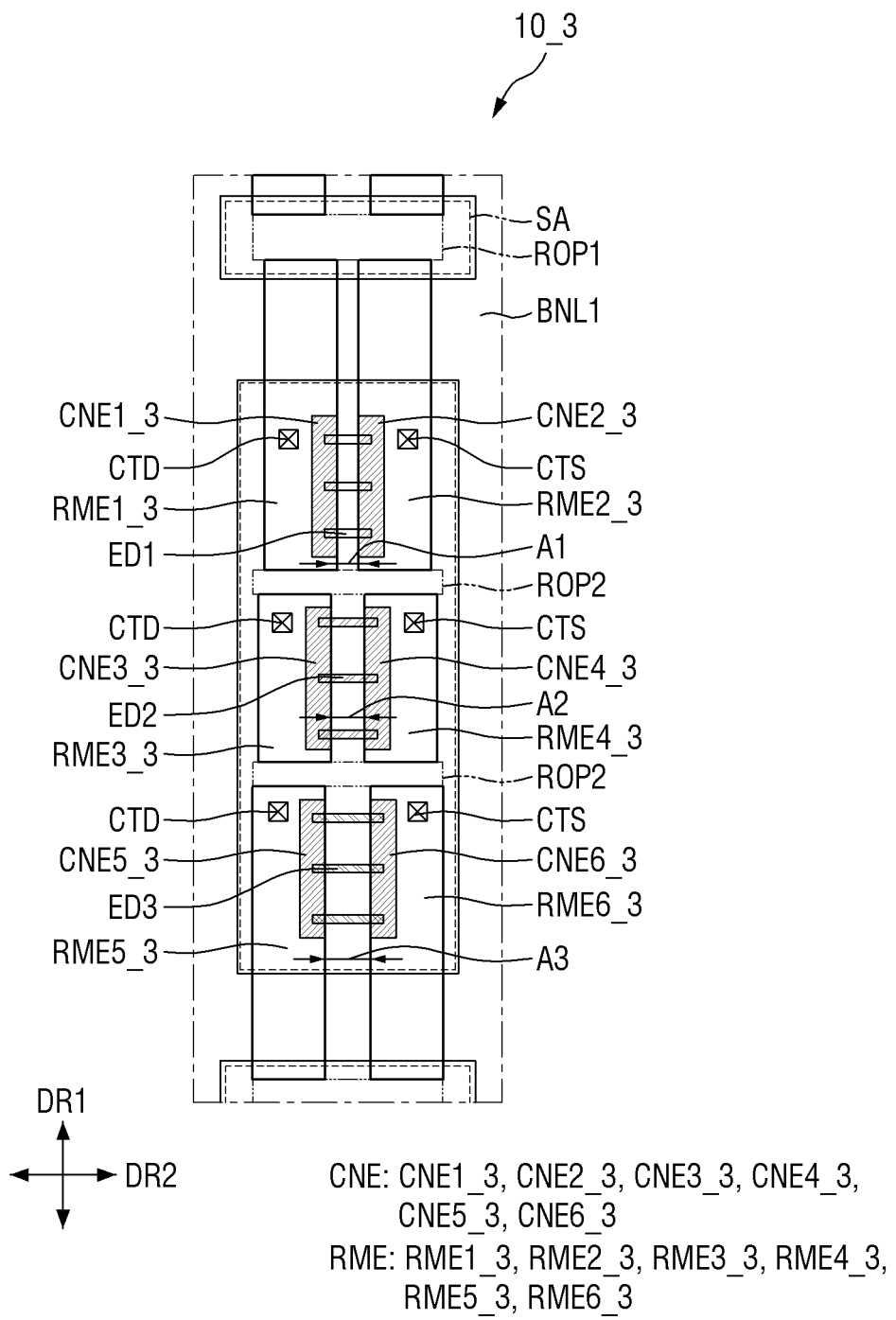
FIG. 14 is a schematic plan view of a subpixel of a display device according to an embodiment.
Figure 15:
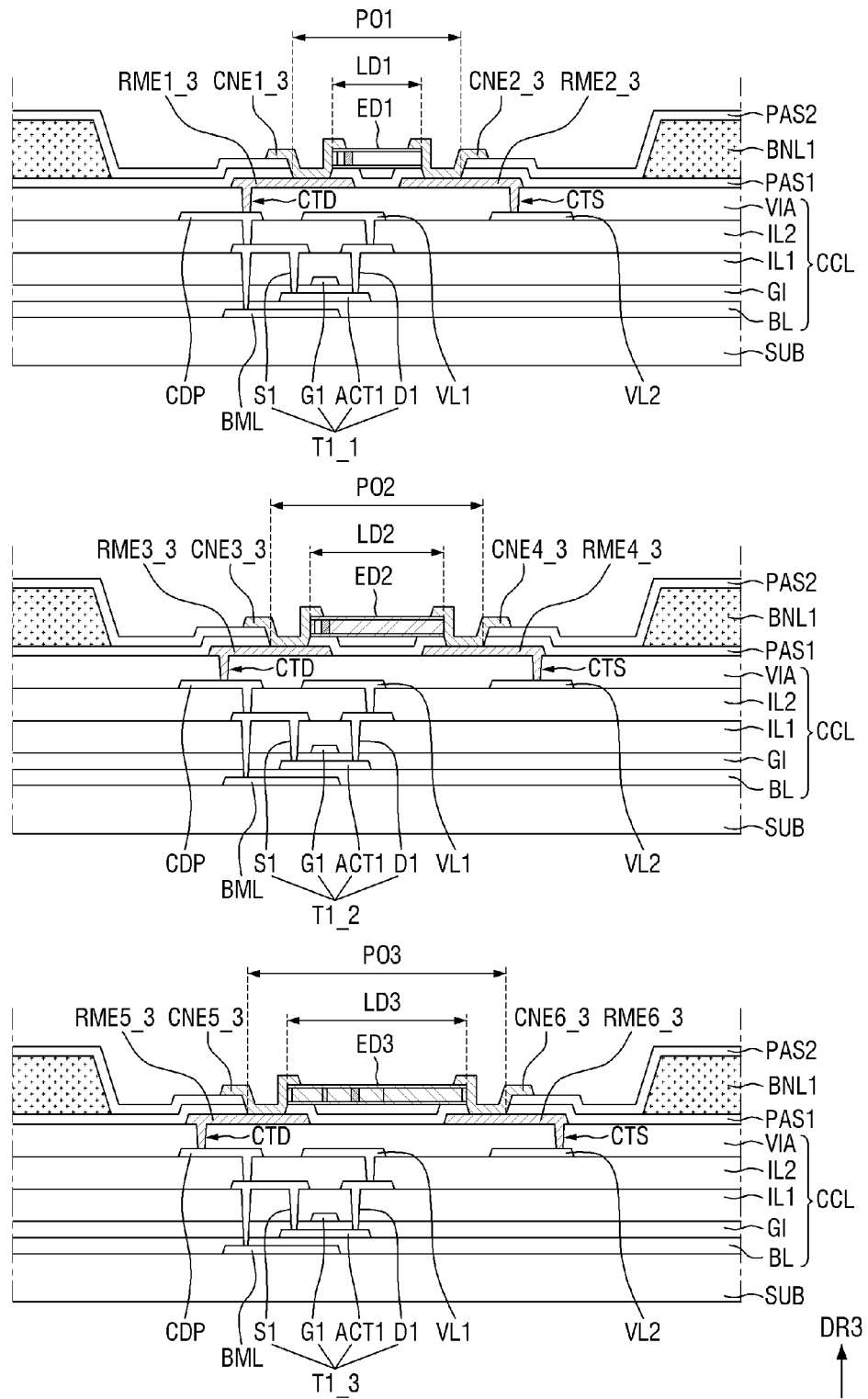
FIG. 15 is a schematic partial cross-sectional view of the display device of FIG. 14.

FIG. 14 is a schematic plan view of a subpixel of a display device 10_3 according to an embodiment. FIG. 15 is a schematic partial cross-sectional view of the display device 10_3 of FIG. 14.

Referring to FIGS. 14 and 15, the display device 10_3 according to the embodiment may include different types of light emitting elements ED, for example light emitting elements ED1, ED2, and ED3, in a subpixel PXn, and the different types of light emitting elements ED may be disposed on electrodes separated from each other. While different types of light emitting elements ED are disposed in different subpixels PXn to emit light of different colors in the display device 10 of FIG. 2, different types of light emitting elements ED may be disposed in each subpixel PXn in the display device 10_3 of FIG. 14.

For example, in a subpixel PXn of the display device 10_3, first light emitting elements ED1, second light emitting elements ED2, and third light emitting elements ED3 may be disposed in an emission area EMA. Each subpixel PXn may include not only a first electrode RME1_3 and a second electrode RME2_3 but also a third electrode RME3_3 spaced apart from the first electrode RME1_3 in the first direction DR1, a fourth electrode RME4_3 spaced apart from the second electrode RME2_3 in the first direction DR1, a fifth electrode RME5_3 spaced apart from the third electrode RME3_3 in the first direction DR1, and a sixth electrode RME6_3 spaced apart from the fourth electrode RME4_3 in the first direction DR1. The first electrode RME1_3, the third electrode RME3_3, and the fifth electrode RME5_3 may be spaced apart from each other in the first direction DR1, and the second electrode RME2_3, the fourth electrode RME4_3, and the sixth electrode RME6_3 may be spaced apart from each other in the first direction DR1. The first electrode RME1_3 and the second electrode RME2_3, the third electrode RME3_3 and the fourth electrode RME4_3, and the fifth electrode RME5_3 and the sixth electrode RME6_3 may be spaced apart from each other to face each other in the second direction DR2, and light emitting elements ED1 to ED3 may be disposed on different electrodes RME. A second separation portion ROP2 may be disposed between the first and second electrodes RME1_3 and RME2_3 and the third and fourth electrodes RME3_3 and RME4_3, and between the third and fourth electrodes RME3_3 and RME4_3 and the fifth and sixth electrodes RME5_3 and RME6_3.

In an embodiment, the first light emitting elements ED1 may be disposed on the first electrode RME1_3 and the second electrode RME2_3 spaced apart from each other by a first distance A1, the second light emitting elements ED2 may be disposed on the third electrode RME3_3 and the fourth electrode RME4_3 spaced apart from each other by a second distance A2, and the third light emitting elements ED3 may be disposed on the fifth electrode RME5_3 and the sixth electrode RME6_3 spaced apart from each other by a third distance A3. The first distance A1 may be smaller than the second distance A2 and the third distance A3, and the second distance A2 may be smaller than the third distance A3. Two of electrodes RME may form a pair, may be spaced apart from each other in the second direction DR2, and may be spaced apart from another pair of electrodes RME in the first direction DR1. The distance A1, A2, or A3 between a pair of electrodes RME may vary according to a length LD1, LD2 or LD3 of the light emitting element ED1, ED2, or ED3. Even if the light emitting elements ED1 to ED3 are sprayed to the same area surrounded by a first bank BNL1, they may be disposed on different pairs of electrodes RME. The first light emitting elements ED1, the second light emitting elements ED2, and the third light emitting elements ED3 may be spaced apart from each other in a direction in which different pairs of electrodes RME are spaced apart from each other, for example, in the first direction DR1.

Each subpixel PXn of the display device 10_3 may further include a third contact electrode CNE3_3 disposed on the third electrode RME3_3, a fourth contact electrode CNE4_3 disposed on the fourth electrode RME4_3, a fifth contact electrode CNE5_3 disposed on the fifth electrode RME5_3, and a sixth contact electrode CNE6_3 disposed on the sixth electrode RME6_3. Each contact electrode CNE may electrically contact an end of a light emitting element ED and one of the electrodes RME.

The electrodes RME may respectively be electrically connected to different first transistors T1_1 to T1_3 through electrode contact holes CTD and CTS penetrating a via layer VIA disposed under the electrodes RME. For example, the first electrode RME1_3, the third electrode RME3_3, and the fifth electrode RME5_3 may be electrically connected to different first transistors T1_1 to T1_3, respectively. Accordingly, different types of light emitting elements ED1 to ED3 disposed in each subpixel PXn may be disposed on different pairs of electrodes RME to emit light individually.

Figure 16:
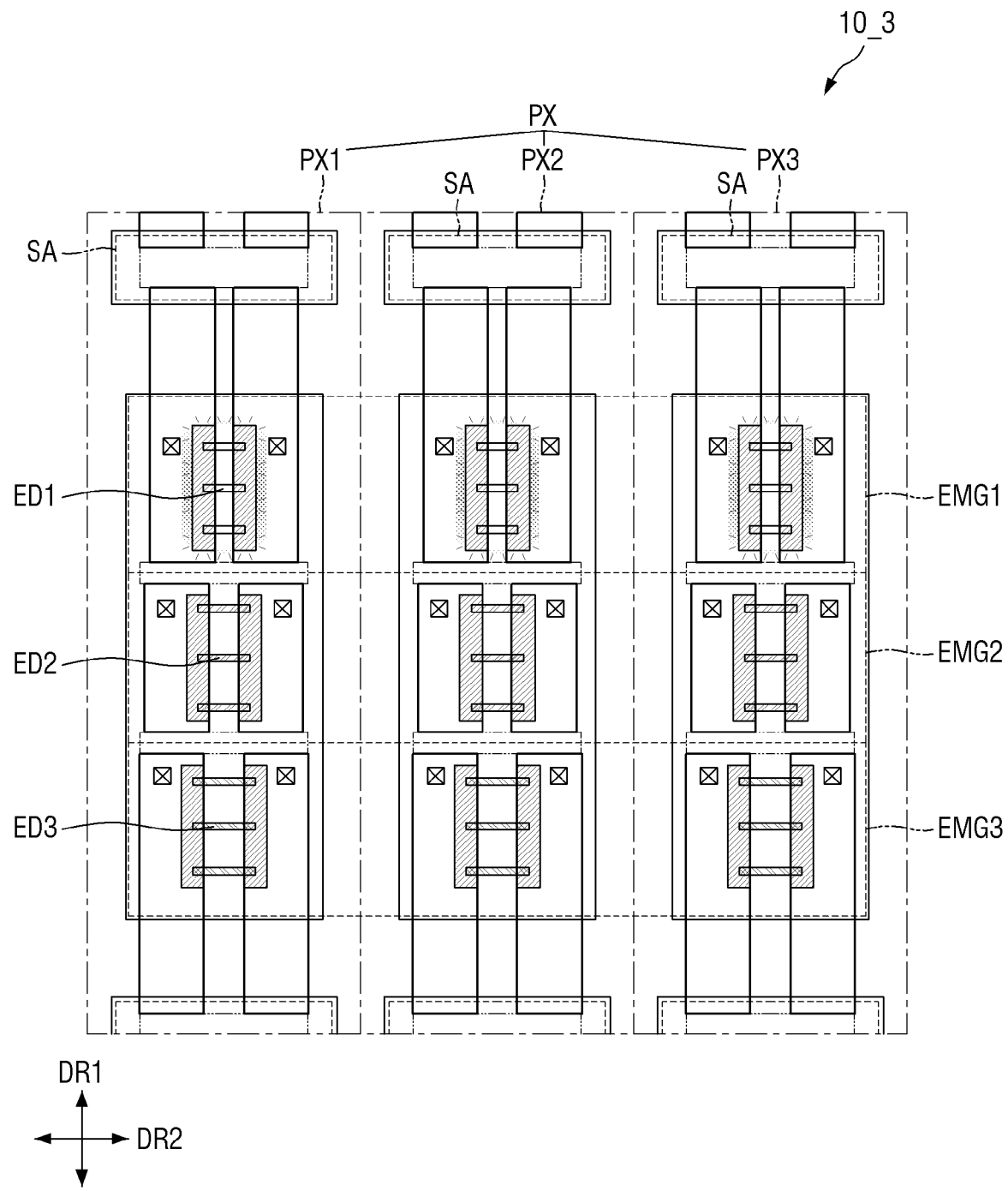
FIG. 16 is a schematic plan view illustrating light emission of light emitting elements in the display device of FIG. 14.

FIG. 16 is a schematic view illustrating light emission of the light emitting elements ED in the display device 10_3 of FIG. 14.

Referring to FIG. 16, in the display device 10_3, emission groups EMG, for example emission groups EMG1, EMG2, and EMG3 may be defined based on the arrangement of the light emitting elements ED in each subpixel PXn, regardless of areas surrounded by the first bank BNL1. The first light emitting elements ED1, the second light emitting elements ED2, and the third light emitting elements ED3 may be disposed in first to third subpixels PX1 to PX3, respectively, and may be spaced apart from each other in the first direction DR1 in the emission area EMA of each subpixel PX1, PX2, or PX3, In the display device 10_3, even if different types of light emitting elements ED are disposed in a subpixel PXn, different pairs of electrodes RME may individually receive electrical signals. Accordingly, the first light emitting elements ED1 disposed in different subpixels PX1 to PX3 may form a first emission group EMG1 to simultaneously emit light, the second light emitting elements ED2 may form a second emission group EMG2, and the third light emitting elements ED3 may form a third emission group EMG3.

In the display device 10_3 according to the embodiment, even if different types of light emitting elements ED are disposed in each subpixel PXn, they may emit light individually according to the type of the light emitting elements ED. The distance A1, A2, or A3 in the second direction DR2 between each of different pairs of electrodes RME disposed in each subpixel PXn may be designed according to the length LD1, LD2, or LD3 of the light emitting element ED1, ED2, or ED3. Even if ink in which different types of light emitting elements ED are mixed is used in an inkjet printing process of spraying the light emitting elements ED, the display device 10_3 may be advantageous in fabrication process because different types of light emitting elements ED can be placed on different pairs of electrodes RME.

In the display device 10_3 of FIG. 14, the electrodes RME separated from each other may be disposed in each subpixel PXn. However, the disclosure is not limited thereto, and the distance between an electrode RME and another electrode RME may be adjusted according to positions.

Figure 17:
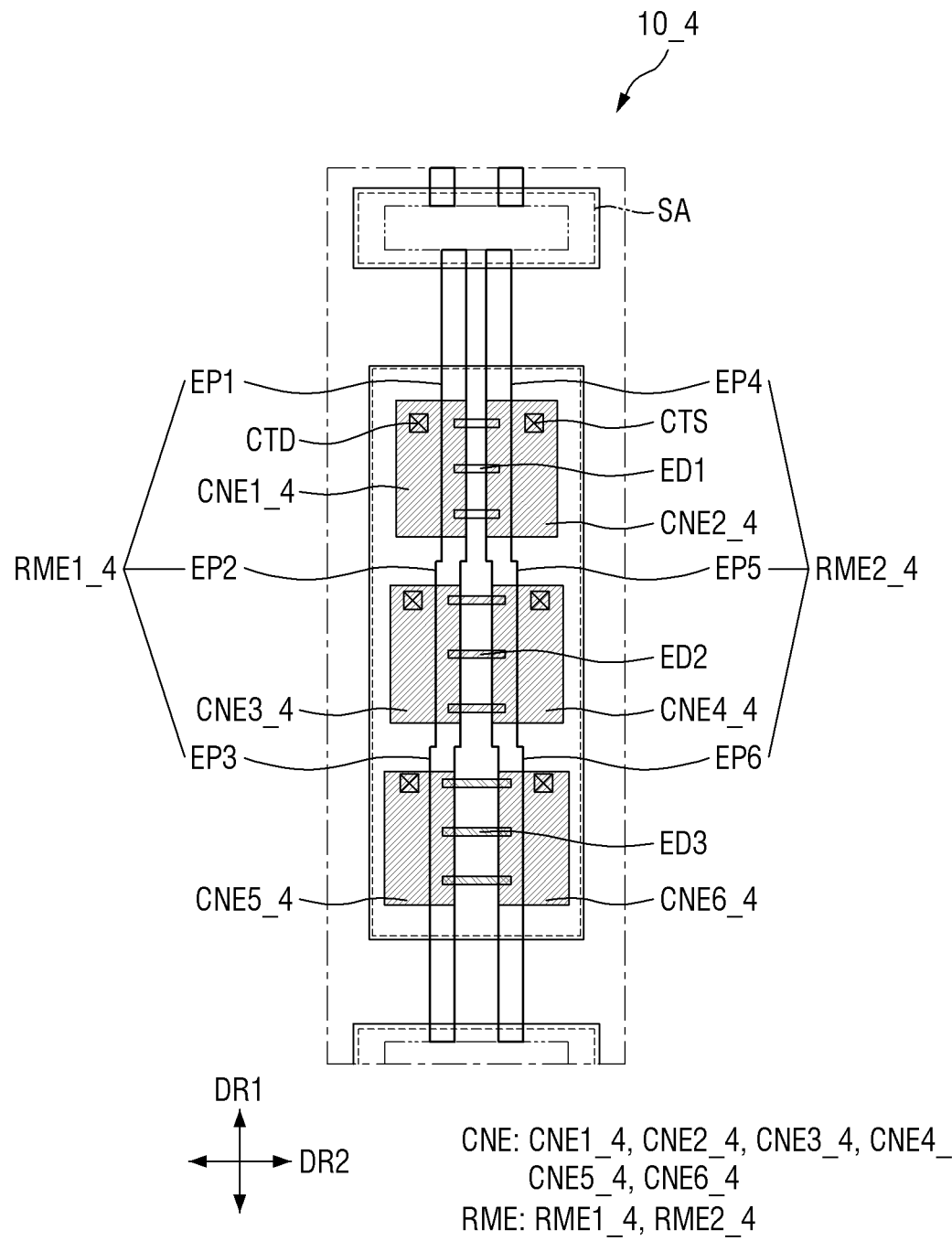
FIG. 17 is a schematic plan view of a subpixel of a display device according to an embodiment.
Figure 18:
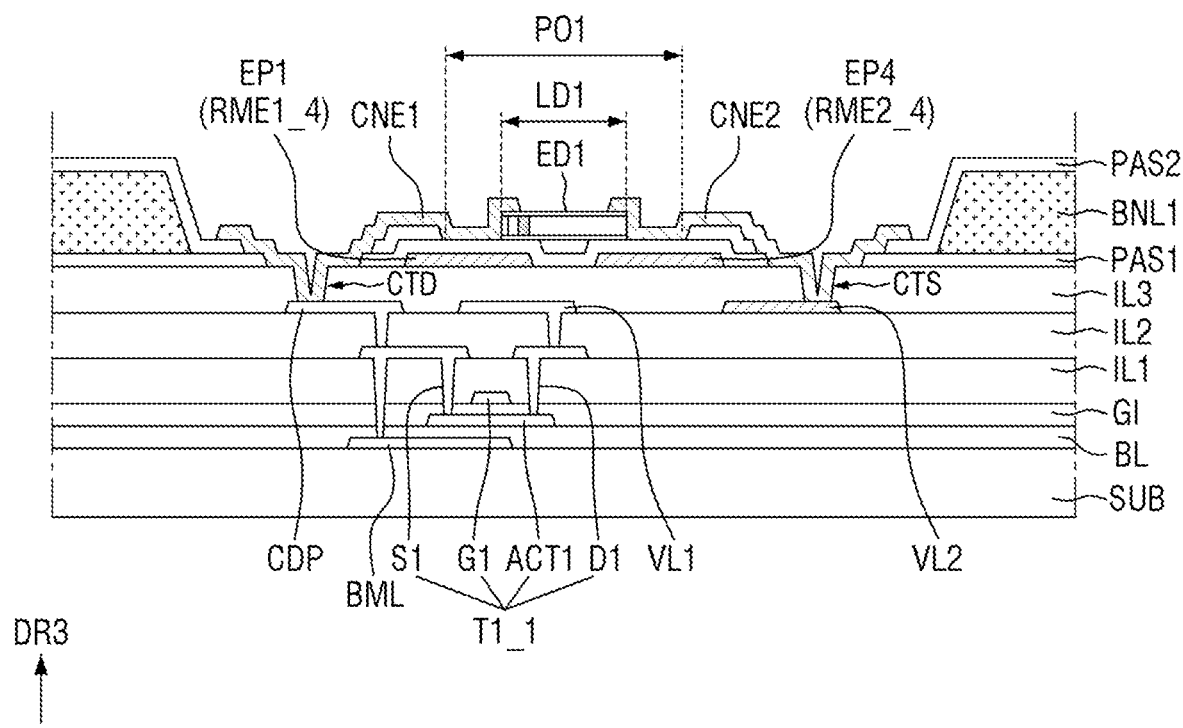
FIG. 18 is a partial schematic cross-sectional view of the display device of FIG. 17.

FIG. 17 is a schematic plan view of a subpixel PXn of a display device 104 according to an embodiment. FIG. 18 is a schematic partial cross-sectional view of the display device 104 of FIG. 17.

Referring to FIGS. 17 and 18, in the display device 10_4 according to the embodiment, a subpixel PXn may include different types of light emitting elements ED1 to ED3, and the different types of light emitting elements ED1 to ED3 may be disposed on the electrodes RME1_4 and RME2_4. The electrodes RME1_4 and RME2_4 may include electrode portions EP1 to EP6 spaced apart from each other by different distances in the second direction DR2.

A first electrode RME1_4 of the display device 104 may include a first electrode portion EP1, a second electrode portion EP2, and a third electrode portion EP3, and a second electrode RME2_4 may include a fourth electrode portion EP4, a fifth electrode portion EP5, and a sixth electrode portion EP6. The first electrode portion EP1 may be spaced apart from the fourth electrode portion EP4 to face the fourth electrode portion EP4 in the second direction DR2, the second electrode portion EP2 may be spaced apart from the fifth electrode portion EP5 to face the fifth electrode portion EP5 in the second direction DR2, and the third electrode portion EP3 may be spaced apart from the sixth electrode portion EP6 to face the sixth electrode portion EP6 in the second direction DR2. According to an embodiment, a distance between the first electrode portion EP1 and the fourth electrode portion EP4 may be smaller than a distance between the second electrode portion EP2 and the fifth electrode portion EP5, and the distance between the second electrode portion EP2 and the fifth electrode portion EP5 may be smaller than a distance between the third electrode portion EP3 and the sixth electrode portion EP6. The distance between the electrode portions may be designed according to a length LD1, LD2, or LD3 of the light emitting element ED1, ED2, or ED3, and different types of light emitting elements ED1 to ED3 may be disposed on different pairs of electrode portions.

For example, first light emitting elements ED1 may be disposed on the first electrode portion EP1 and the fourth electrode portion EP4, second light emitting elements ED2 may be disposed on the second electrode portion EP2 and the fifth electrode portion EP5, and third light emitting elements ED3 may be disposed on the third electrode portion EP3 and the sixth electrode portion EP6.

Contact electrodes CNE may be disposed on the first electrode RME1_4 or the second electrode RME2_4 but may be disposed on different electrode portions, Since electrode portions are electrically connected to each other to form an electrode RME1_4 or RME2_4, the contact electrodes CNE may be directly connected to a fourth conductive layer through electrode contact holes CTD and CTS so that different light emitting elements ED may emit light individually.

A first contact electrode CNE1_4 and a second contact electrode CNE2_4 may be disposed on the first electrode portion EP1 and the fourth electrode portion EP4, respectively, but may not electrically contact them. However, the first contact electrode CNE1_4 may directly contact a first conductive pattern CDP through a first electrode contact hole CTD, and the second contact electrode CNE2_4 may directly contact a second voltage wiring VL2 through a second electrode contact hole CTS. Similarly, a third contact electrode CNE3_4 and a fourth contact electrode CNE4_4 may be disposed on the second electrode portion EP2 and the fifth electrode portion EP5, respectively, but may not electrically contact them. A fifth contact electrode CNE5_4 and a sixth contact electrode CNE6_4 may be disposed on the third electrode portion EP3 and the sixth electrode portion EP6, respectively, but may not electrically contact them. The contact electrodes CNE may be wider than the first electrode RME1_4 and the second electrode RME2_4 and may directly contact the fourth conductive layer through the electrode contact holes CTD and CTS penetrating a via layer VIA. Accordingly, even if the light emitting elements ED1 to ED3 are disposed on electrode portions (e.g., the first to third electrode portions EP1 to EP3 or the fourth to sixth electrode portions EP4 to EP6) which are electrically connected to each other to form an electrode RME1_4 or RME2_4, they may emit light individually through the contact electrodes CNE.

Figure 19:
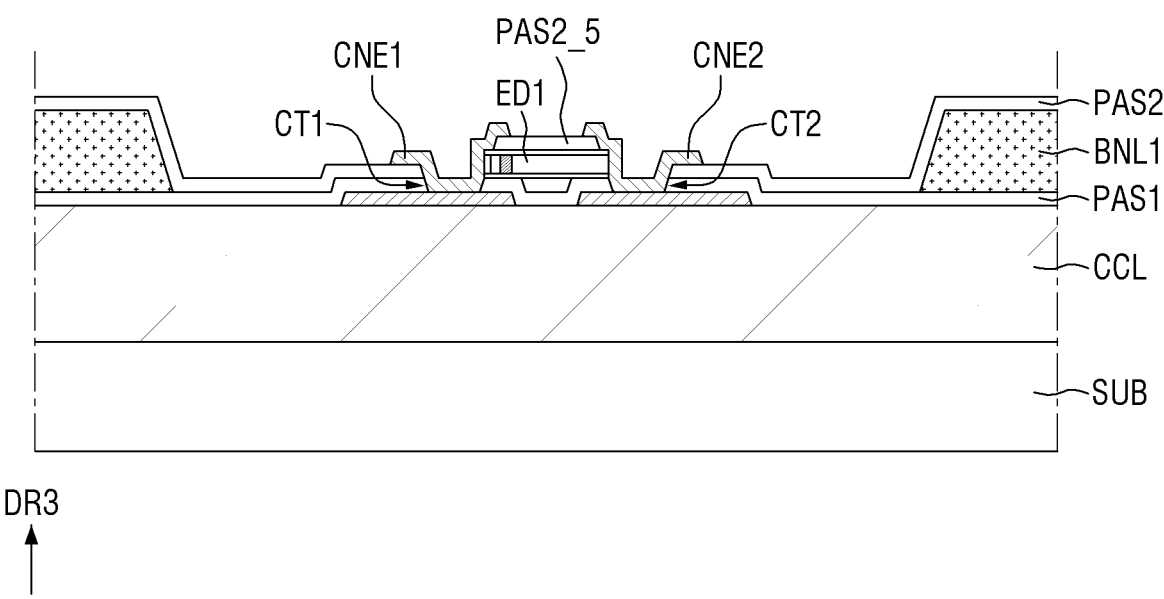
FIG. 19 is a partial schematic cross-sectional view of a display device according to an embodiment.

FIG. 19 is a schematic partial cross-sectional view of a display device 10_5 according to an embodiment.

Referring to FIG. 19, in the display device 10_5 according to the embodiment, a second insulating layer PAS2_5 may cover or overlap a portion of a light emitting element ED. The second insulating layer PAS2_5 may be disposed on a first insulating layer PAS1 and the light emitting element ED but may expose only ends of the light emitting element ED. According to an embodiment, at least a portion of the second insulating layer PAS2_5 may surround an outer surface of the light emitting element ED to protect the light emitting element ED while affixing the light emitting element ED during a process of fabricating the display device 10_5. A portion of the second insulating layer PAS2_5 which is disposed on the light emitting element ED may extend in the first direction DR1 on the first insulating layer PAS1 in a plan view to form a linear or island-like pattern in each subpixel PXn. The embodiment may be different from the embodiment of FIG. 4 at least in that the second insulating layer PAS2_5 further includes a portion covering the light emitting element ED. Thus, a redundant description will be omitted.

A display device according to an embodiment may include light emitting elements which emit light of a different color for each subpixel and have different lengths. A distance between electrodes in each subpixel may be designed according to lengths of the light emitting elements. In a process of fabricating the display device, even if ink sprayed in an inkjet printing process overflows to other subpixels, only light emitting elements corresponding to each subpixel may be electrically connected to the electrodes to emit light.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a plurality of subpixels, each of the plurality of subpixels comprising:
     a first electrode comprising an inner side and an outer side extending in a first horizontal direction;
     a second electrode comprising an inner side and an outer side extending in the first horizontal direction and spaced apart from the first electrode in a second horizontal direction, the inner side of the second electrode facing the inner side of the first electrode; and
     a plurality of light emitting elements disposed on the first electrode and the second electrode and extending in the second horizontal direction,
   wherein the plurality of subpixels comprise:
     a first subpixel comprising first light emitting elements each having a first length in the second horizontal direction, the first light emitting elements arranged and spaced apart from each other in the first horizontal direction; and
     a second subpixel adjacent to the first subpixel in the first horizontal direction, the second subpixel comprising second light emitting elements each having a second length greater than the first length in the second horizontal direction, the second light emitting elements arranged and spaced apart from each other in the first horizontal direction, wherein
   a first distance between the inner side of the first electrode and the inner side of the second electrode of the first subpixel in the second horizontal direction is smaller than a second distance between the inner side of the first electrode and the inner side of the second electrode of the second subpixel in the second horizontal direction,
   a third distance between the outer side of the first electrode and the outer side of the second electrode of the first subpixel in the second horizontal direction is smaller than a fourth distance between the outer side of the first electrode and the outer side of the second electrode of the second subpixel in the second horizontal direction,
   the first and second electrodes of the first subpixel are adjacent to the first and second electrodes of the second subpixel, respectively, in the first horizontal direction,
   the inner side of the first electrode of the second subpixel is shifted leftward relative to the inner side of the first electrode of the first subpixel,
   the inner side of the second electrode of the second subpixel is shifted rightward relative to the inner side of the second electrode of the first subpixel,
   the outer side of the first electrode of the second subpixel is shifted leftward relative to the outer side of the first electrode of the first subpixel, and
   the outer side of the second electrode of the second subpixel is shifted rightward relative to the outer side of the second electrode of the first subpixel.

2. The display device of claim 1, wherein in the first subpixel, the first distance is smaller than the first length of each of the first light emitting elements.

3. The display device of claim 1, wherein widths of the first electrode and the second electrode of the first subpixel are equal to widths of the first electrode and the second electrode of the second subpixel, respectively.

4. The display device of claim 1, wherein the second distance between the first electrode and the second electrode of the second subpixel is equal to the first length of each of the first light emitting elements.

5. The display device of claim 1, wherein a difference between the second length of each of the second light emitting elements and the first length of each of the first light emitting elements is equal to a sum of widths of portions of the first electrode and the second electrode which overlap the first light emitting elements.

6. The display device of claim 1, wherein the plurality of subpixels further comprise a third subpixel comprising third light emitting elements each having a third length greater than the second length in the second horizontal direction.

7. The display device of claim 6, wherein a third distance between the first electrode and the second electrode of the third subpixel is equal to the second length of each of the second light emitting elements.

8. The display device of claim 1, wherein
   each of the plurality of subpixels comprises:
     a first insulating layer disposed on the first electrode and the second electrode, the first insulating layer comprising:
       a first contact portion exposing a portion of an upper surface of the first electrode; and
       a second contact portion exposing a portion of an upper surface of the second electrode; and
     a second insulating layer disposed on the first insulating layer, the second insulating layer comprising an opening exposing ends of each of the plurality of light emitting elements, and
   the opening of the second insulating layer exposes the first contact portion and the second contact portion of the first insulating layer.

9. The display device of claim 8, wherein a width of the opening of the second insulating layer in the first subpixel is equal to the second length of each of the second light emitting elements.

10. The display device of claim 1, further comprising:
a first contact electrode disposed on the first electrode and electrically contacting first ends of the plurality of light emitting elements and the first electrode; and
a second contact electrode disposed on the second electrode and electrically contacting second ends of the plurality of light emitting elements and the second electrode.

11. The display device of claim 10, wherein
the first electrode and the first contact electrode have a same width,
the second electrode and the second contact electrode have a same width, and
a width of a portion of the first electrode which overlaps the plurality of light emitting elements is half the width of the first electrode.

12. The display device of claim 11, wherein a distance between the first electrode and the second electrode is equal to a difference between a length of each of the light emitting elements and the width of the first electrode.

13. The display device of claim 1, further comprising:
a third subpixel adjacent to the second subpixel in the first horizontal direction, the third subpixel comprising third light emitting elements each having a third length in the second horizontal direction, the third light emitting elements arranged and spaced apart from each other in the first horizontal direction,
the inner side of the first electrode of the third subpixel is shifted leftward relative to the inner side of the first electrode of the second subpixel,
the inner side of the second electrode of the third subpixel is shifted rightward relative to the inner side of the second electrode of the second subpixel,
the outer side of the first electrode of the third subpixel is shifted leftward relative to the outer side of the first electrode of the second subpixel, and
the outer side of the second electrode of the third subpixel is shifted rightward relative to the outer side of the second electrode of the second subpixel.

14. The display device of claim 13, wherein
the first electrode of the first subpixel, the first electrode of the second subpixel, and the first electrode of the third subpixel are continuously connected to each other, and
the second electrode of the first subpixel, the second electrode of the second subpixel, and the second electrode of the third subpixel are continuously connected to each other.

15. The display device of claim 13, wherein
the first electrode of the first subpixel, the first electrode of the second subpixel, and the first electrode of the third subpixel are disconnected from each other in the first horizontal direction, and
the second electrode of the first subpixel, the second electrode of the second subpixel, and the second electrode of the third subpixel are disconnected from each other in the first horizontal direction.

16. A display device comprising:
a plurality of electrodes comprising inner sides and outer sides extending in a first direction and spaced apart from each other in a second direction, the inner sides of the plurality of electrodes facing each other;
a first insulating layer disposed on the plurality of electrodes;
a plurality of light emitting elements disposed on the first insulating layer and having ends disposed on the plurality of electrodes spaced apart in the second direction; and
a plurality of contact electrodes disposed on at least one of the plurality of electrodes to electrically contact the plurality of light emitting elements,
wherein the plurality of light emitting elements comprise:
first color light emitting elements having a first length in the second direction;
second color light emitting elements having a second length greater than the first length in the second direction and spaced apart from the first color light emitting elements in the first direction; and
third light emitting elements having a third length greater than the first length and the second length in the second direction and spaced apart from the first color light emitting elements and the second color light emitting elements in the first direction,
a distance between the inner sides of the plurality of electrodes on which the first color light emitting elements are disposed is smaller than a distance between the inner sides of the plurality of electrodes on which the second color light emitting elements are disposed, and
a distance between the outer sides of the plurality of electrodes on which the first color light emitting elements are disposed is smaller than a distance between the outer sides of the plurality of electrodes on which the second color light emitting elements are disposed,
wherein
the plurality of electrodes comprise:
a first electrode;
a second electrode spaced apart from the first electrode in the second direction;
a third electrode adjacent to the first electrode in the first direction; and
a fourth electrode adjacent to the second electrode in the first direction and spaced apart from the third electrode in the second direction;
the first color light emitting elements are disposed on the first electrode and the second electrode,
the second color light emitting elements are disposed on the third electrode and the fourth electrode,
the inner side of the first electrode is shifted leftward relative to the inner side of the third electrode,
the inner side of the second electrode is rightward relative to the inner side of the fourth electrode,
the outer side of the first electrode is shifted leftward relative to the outer side of the third electrode, and
the outer side of the second electrode is shifted rightward relative to the outer side of the fourth electrode.

17. The display device of claim 16, wherein
the plurality of contact electrodes comprise:
a first contact electrode which electrically contacts an end of each of the first color light emitting elements;
a second contact electrode which electrically contacts another end of each of the first color light emitting elements;
a third contact electrode which electrically contacts an end of each of the second color light emitting elements; and
a fourth contact electrode which electrically contacts another end of each of the second color light emitting elements.

18. The display device of claim 16, wherein
the plurality of electrodes further comprise:
- a fifth electrode adjacent to the third electrode in the first direction; and
- a sixth electrode adjacent to the fourth electrode in the first direction and spaced apart from the fifth electrode in the second direction, the third light emitting elements are disposed on the fifth electrode and the sixth electrode, a first distance between the first electrode and the second electrode is smaller than a second distance between the third electrode and the fourth electrode, the second distance between the third electrode and the fourth electrode is smaller than a third distance between the fifth electrode and the sixth electrode, the inner side of the third electrode is shifted leftward relative to the inner side of the fifth electrode, the inner side of the fourth electrode is shifted rightward relative to the inner side of the sixth electrode, the outer side of the third electrode is shifted leftward relative to the outer side of the fifth electrode, and the outer side of the fourth electrode is shifted rightward relative to the outer side of the sixth electrode.

19. The display device of claim 18, wherein
the first insulating layer comprises a plurality of contact portions which partially expose upper surfaces of the plurality of electrodes, and the plurality of contact electrodes electrically contact ends of the plurality of light emitting elements and portions of the upper surfaces of the plurality of electrodes exposed through the plurality of contact portions.

* * * * *